United States Patent
Kataoka et al.

(10) Patent No.: US 7,095,077 B2
(45) Date of Patent: Aug. 22, 2006

(54) SEMICONDUCTOR MEMORY HAVING TWO CHARGE STORAGE SECTIONS

(75) Inventors: Kotaro Kataoka, Tenri (JP); Hiroshi Iwata, Nara (JP); Akihide Shibata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/824,394

(22) Filed: Apr. 15, 2004

(65) Prior Publication Data

US 2004/0232475 A1 Nov. 25, 2004

(30) Foreign Application Priority Data

May 20, 2003 (JP) ............... 2003-141877

(51) Int. Cl.
*H01L 29/792* (2006.01)

(52) U.S. Cl. .............. 257/324; 257/314; 257/315; 257/316; 257/320; 257/321; 257/322; 257/326

(58) Field of Classification Search ............ None
See application file for complete search history.

(56) References Cited

U.S. PATENT DOCUMENTS

| | | | |
|---|---|---|---|
| 4,881,108 A | | 11/1989 | Yoshikawa |
| 5,438,542 A | * | 8/1995 | Atsumi et al. ............ 365/182 |
| 5,969,383 A | * | 10/1999 | Chang et al. ............. 257/316 |
| 6,011,725 A | * | 1/2000 | Eitan ..................... 365/185.33 |
| 6,335,554 B1 | * | 1/2002 | Yoshikawa ............. 257/316 |
| 6,348,711 B1 | * | 2/2002 | Eitan ..................... 257/316 |
| 6,434,053 B1 | | 8/2002 | Fujiwara |
| 6,627,498 B1 | * | 9/2003 | Willer et al. ............ 438/257 |

FOREIGN PATENT DOCUMENTS

| | | |
|---|---|---|
| JP | 09-116119 A | 5/1997 |
| JP | 2001-156188 A | 6/2001 |
| JP | 2001-196461 A | 7/2001 |
| JP | 2002-246571 A | 8/2002 |
| WO | WO 99/07000 A2 | 2/1999 |
| WO | WO 01/17030 A1 | 3/2001 |
| WO | WO 03/044868 A1 | 5/2003 |
| WO | WO 03/075358 A1 | 9/2003 |
| WO | WO 03/075359 A1 | 9/2003 |
| WO | WO 03/103058 A1 | 12/2003 |
| WO | WO 04/034474 A1 | 4/2004 |

* cited by examiner

*Primary Examiner*—Andy Huynh
(74) *Attorney, Agent, or Firm*—Birch, Stewart, Kolasch & Birch, LLP

(57) ABSTRACT

A semiconductor memory includes: a p-type semiconductor (p-type semiconductor film on a substrate, a p-type well region in a semiconductor substrate, or an insulator); a gate insulating film formed on the p-type semiconductor; a gate electrode formed on the gate insulating film; two charge storage sections formed on side walls of the gate electrode; a channel region provided below the gate electrode; and a first n-type diffusion layer region and a second n-type diffusion layer region provided to sides of the channel region, wherein: the charge storage sections are arranged to change an electric current flow between the first n-type diffusion layer region and the second n-type diffusion layer region under application of a voltage to the gate electrode according to the quantity of electric charges stored in the charge storage sections; and the first n-type diffusion layer region is set to a reference voltage, the other n-type diffusion layer region is set to a voltage greater than the reference voltage, and the gate electrode is set to a voltage greater than the reference voltage. Thus, the semiconductor memory obtained is capable of 2 bit operation and easy to miniaturize.

40 Claims, 12 Drawing Sheets

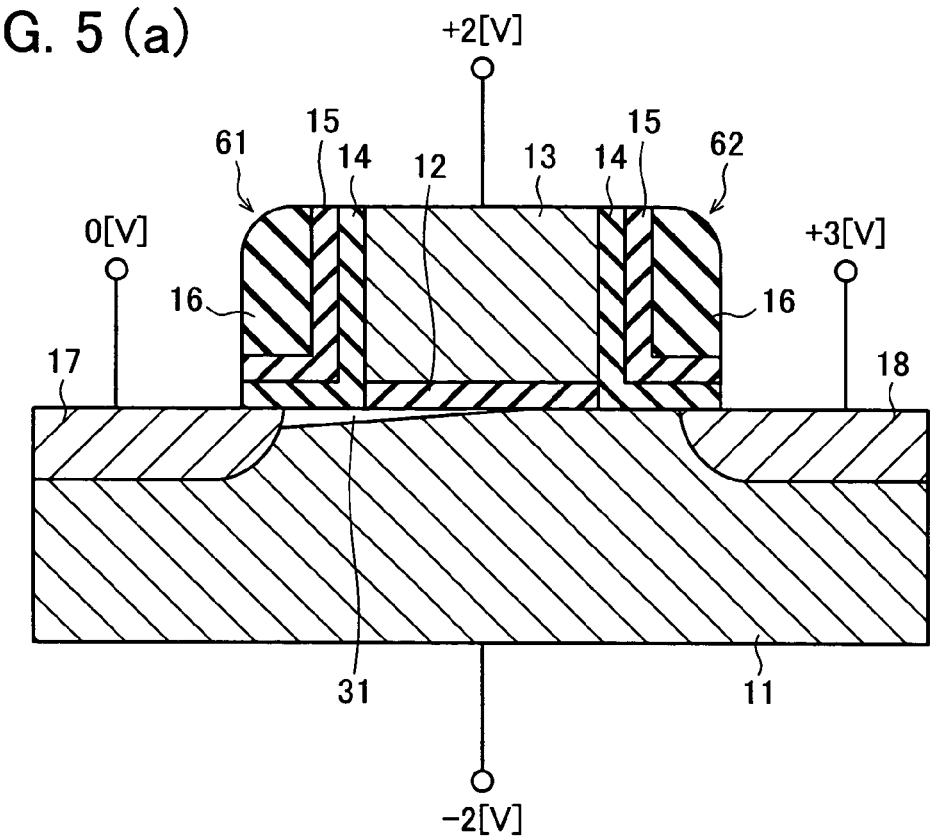
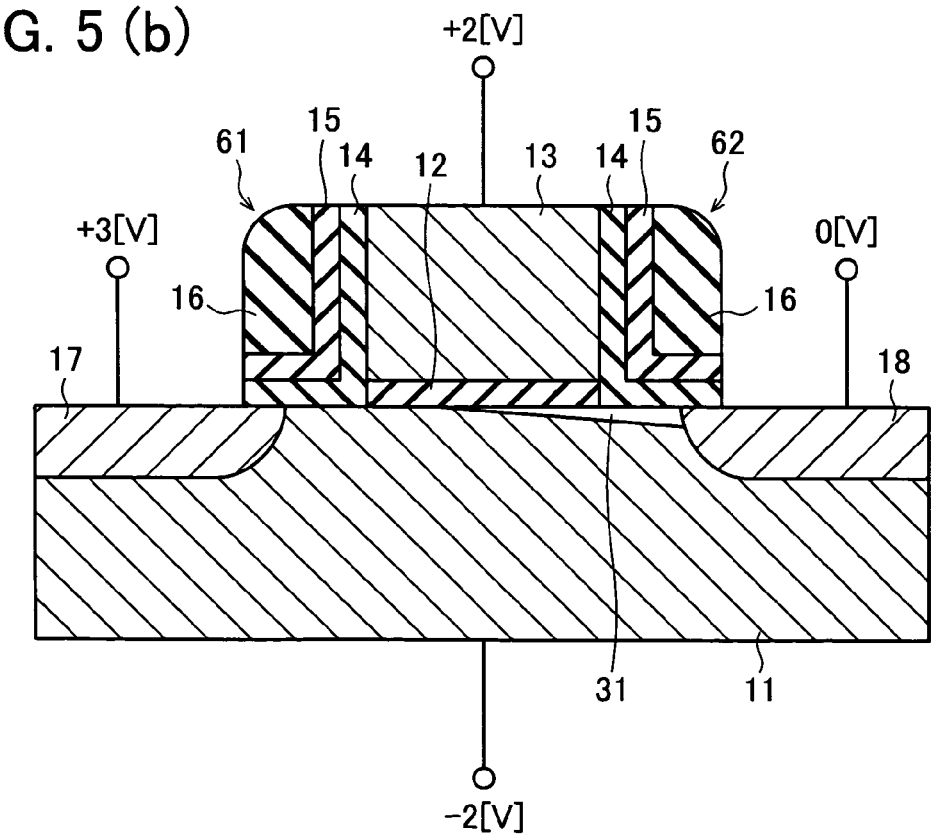

SEMICONDUCTOR MEMORY HAVING TWO CHARGE STORAGE SECTIONS

This Nonprovisional application claims priority under 35 U.S.C. § 119(a) on Patent Application No. 2003-141877 filed in Japan on May 20, 2003, the entire contents of which are hereby incorporated by reference.

FIELD OF THE INVENTION

The present invention relates in general to semiconductor memories characterized by their operation principles, and in particular to those made up of field-effect transistors capable of converting an electric charge variation to an electric current.

BACKGROUND OF THE INVENTION

Saifun Semiconductors Ltd. has developed a conventional, exemplary involatile memory consisting of 2-bit field-effect transistors. See, among others, published Japanese translation of PCT publication 2001-512290 (Tokuhyo 2001-512290; published on Jun. 8, 2001), an equivalent to WO99/07000 published on 11 Feb. 1999. The structure of this conventional art memory will be discussed below.

The memory, as shown in FIG. 21, includes (i) a gate electrode 909 formed above a p-type well region 901 with an intervening gate insulating film and (ii) a first n-type diffusion layer region (n-impurities diffusion region) 902 and a second n-type diffusion layer region 903 formed on the surface of the p-type well region 901. The gate insulating film is made of "ONO" (Oxide Nitride Oxide) stacks where silicon oxide films 904, 905 sandwich a silicon nitride film 906. In the silicon nitride film 906, near the ends of the first n-type diffusion layer region 902 and the second n-type diffusion layer region 903 are there provided respectively a memory (charge) retentive section 907 and a memory (charge) retentive section 908.

The charge in these memory retentive sections 907, 908 is individually read out in the form of the transistor's drain current so that a single transistor can store 2 bits of information.

However, in the memory, the gate insulating film is difficult to make thinner, because the gate insulating film has a three-layer, or ONO, structure so that the film will give functionality to the transistor and behave by itself as a memory film storing electric charge. Further, at shorter channel lengths, the memory retentive sections 907, 908 in each transistor have difficulty in the 2 bit operation due to increasing interference with each other. These factors have been obstructing further miniaturization of the device.

SUMMARY OF THE INVENTION

Various example embodiments are disclosed that are directed to further miniaturization of a 2-bit-per-transistor semiconductor memory.

A first aspect of the semiconductor memory can include:
a p-type semiconductor film provided on a p-type semiconductor substrate, a p-type well region in a semiconductor substrate, or an insulator;
a gate insulating film formed on the p-type semiconductor film provided on a p-type semiconductor substrate, a p-type well region in a semiconductor substrate, or an insulator;
a gate electrode formed on the gate insulating film;
two charge storage sections formed on side walls of the gate electrode;
a channel region provided below the gate electrode; and
a first n-type diffusion layer (impurity diffusion layer) region and a second n-type diffusion layer (impurity diffusion layer) region provided to sides of the channel region,
wherein:
the charge storage sections are arranged to change an electric current flow between the first n-type diffusion layer region (one of the n-type diffusion layer regions) and the second n-type diffusion layer region (the other n-type diffusion layer region) under application of a voltage to the gate electrode according to a quantity of electric charge stored in the charge storage sections; and
the first n-type diffusion layer region is set to a reference voltage, the second n-type diffusion layer region is set to a voltage greater than the reference voltage, and the gate electrode is set to a voltage greater than the reference voltage, so as to inject electrons to one of the charge storage sections near the second n-type diffusion layer region.

According to this aspect, the two charge storage sections formed on side walls of the gate electrode are independent from the gate insulating film; therefore, the memory functions performed by the charge storage sections are separate from the transistor operation functions performed by the gate insulating film. Consequently, short channel effects can be readily restrained by thinning down the gate insulating film while maintaining sufficient memory functions. In addition, the two charge storage sections formed on side walls of the gate electrode are separated by the gate electrode, and effectively restrained from interfering with each other in rewrite operation. In other words, the two charge storage sections can be placed at a reduced distance.

Further, by suitably setting the voltage on the gate electrode, the voltage on the first n-type diffusion layer region, and the voltage on the second n-type diffusion layer region, electrons can be injected selectively into one of the charge storage sections near the second n-type diffusion layer region.

Thus, the semiconductor memory obtained is capable of 2 bit operation and easy to miniaturize.

A second aspect of the semiconductor memory can include:
an n-type semiconductor film provided on an n-type semiconductor substrate, an n-type well region in a semiconductor substrate, or an insulator;
a gate insulating film formed on the n-type semiconductor film provided on an n-type semiconductor substrate, an n-type well region in a semiconductor substrate, or an insulator;
a gate electrode formed on the gate insulating film;
two charge storage sections formed on side walls of the gate electrode;
a channel region provided below the gate electrode; and
a first p-type diffusion layer region and a second p-type diffusion layer region provided to sides of the channel region,
wherein:
the charge storage sections are arranged to change an electric current flow between the first p-type diffusion layer region (one of the p-type diffusion layer regions) and the second p-type diffusion layer region (the other p-type diffusion layer region) under application of a voltage to the gate electrode according to a quantity of electric charge stored in the charge storage sections; and
the first p-type diffusion layer region is set to a reference voltage, the second p-type diffusion layer region is set to a voltage less than the reference voltage, and the gate electrode is set to a voltage less than the reference voltage, so as to inject holes to one of the charge storage sections near the second p-type diffusion layer region.

The second aspect of the semiconductor memory is different from the first aspect in that the memory transistor is of a p-channel type. Therefore, the second aspect of the semiconductor memory produces similar function and effects to the first aspect of the semiconductor memory.

Particular features of various example embodiments of the invention will be set forth in part in the description which follows, and in part will become apparent to those skilled in the art upon examination of the following or may be learned by practice of the invention.

BRIEF DESCRIPTION OF THE DRAWINGS

FIGS. 5(a), 5(b) are schematic cross-sectional views of a major part illustrating a second write operation of a semiconductor memory in accordance with the present invention.

DESCRIPTION OF THE EMBODIMENTS

Figure 1:
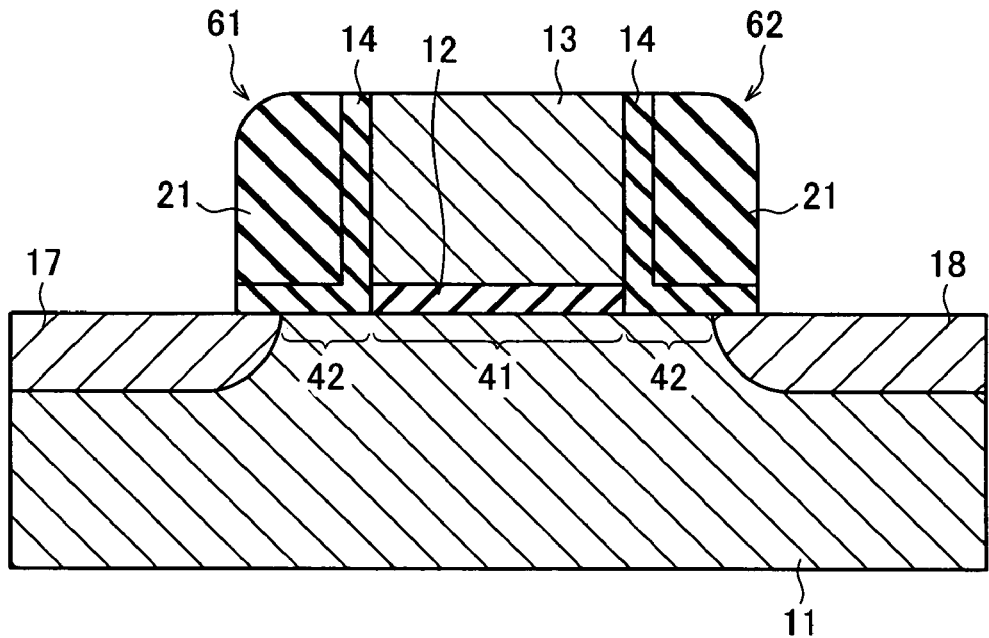
FIG. 1 is a schematic cross-sectional view of a major part of a first example of a semiconductor memory in accordance with a first embodiment of the present invention.

A semiconductor memory in various example embodiments of the present invention is primarily composed of: a gate insulating film; a gate electrode formed on the gate insulating film; charge storage sections, one on each side of the gate electrode; source/drain regions (diffusion layer regions) opposite to the gate electrode from the respective charge storage sections; and a channel region below the gate electrode.

This semiconductor memory is capable of holding 2 or more values per charge storage section, so that it can function as a memory element capable of holding 4 or more values (2 or more bits) of information. However, the semiconductor memory does not necessarily store 4 or more values: the memory may store, for example, 2 values.

The semiconductor memory in accordance with the present invention is preferably formed on a semiconductor substrate, more particularly, on a well region of a first conduction type in a semiconductor substrate.

The semiconductor substrate is not limited in any particular manner, provided that the substrate is designed for use in a semiconductor device. Examples include substrates made of an elemental semiconductor, such as silicon or germanium, or a compound semiconductor, such as GaAs, InGaAs, or ZnSe; SOI (Silicon On Insulator) substrates, multilayer SOI substrates, and like substrates; and glass and polymer (plastic) substrates with a semiconductor layers formed thereon. A preferred one is a silicon substrate or an SOI substrate with the surface semiconductor layer being made of silicon. The semiconductor substrate or layer may be monocrystal (e.g., by epitaxial growth), polycrystalline, or amorphous, although the internal current flow will vary.

On the semiconductor substrate (layer), an element separation region is preferably provided. The semiconductor memory may include a single or multiple layers of transistors, capacitors, resistors, and other elements, circuits made up of these elements, semiconductor devices, and interlayer insulating films. The element separation region can be made from various kinds of element separation film, including LOCOS (Local Oxidation of Silicon) film, trench oxide film, and STI (Shallow Trench Isolation) film. The semiconductor substrate may be either p-type or n-type, and is preferably provided with at least one well region of the first conduction type (either p-type or n-type). The concentrations of impurities in the semiconductor substrate and well region are within the range publicly known in the art. When an SOI substrate is used as the semiconductor substrate, although the surface semiconductor layer may be provided with a well region, a body region may be formed beneath the channel region.

The gate insulating film is not limited in any particular manner, provided that the film is of a kind typically used for semiconductor devices. Examples include insulating films, such as silicon oxide films and silicon nitride films; and high dielectric films, such as aluminum oxide films, titanium oxide films, tantalum oxide films, and hafnium oxide films, in the form of a single or multilayer film. Especially preferred among them is a silicon oxide film. The gate insulating film is easy to thin down, so the film is made up of preferably a double layer, more preferably a single layer. The gate insulating film has a thickness of appropriately, for example, about 1 to 20 nm, preferably 1 to 6 nm. The gate insulating film may be formed only right beneath the gate electrode or beyond (wider than) the gate electrode.

The gate electrode is formed on the gate insulating film in an ordinary manner for use in semiconductor devices. The gate electrode is not limited in any particular manner unless otherwise specified in the embodiment. The gate electrode is made from a single or multilayer conductive film of, for example, a polysilicon; a metal, such as copper or aluminum; a high melting point metal, such as tungsten, titanium, or tantalum; or a high melting point metal silicide. The gate electrode has a thickness of appropriately, for example, about 50 to 400 nm. The channel region, although provided beneath the gate electrode, is preferably extended beyond beneath the gate electrode to the region containing outer sides of the gate ends in the gate length direction. When this is the case, it is preferred if those parts of the channel region not covered with the gate electrode are covered with a gate insulating film or charge storage sections (detailed later). The gate electrode has a gate length of preferably from 0.015 µm to 0.5 µm, inclusive. These gate lengths allow sufficient generation of holes or electrons at a PN junction of a p- or n-type semiconductor substrate (p- or n-type well region, p- or n-type semiconductor film) and a diffusion layer region of n- or p-type, for supply to the charge storage sections. The lengths also ensure transistor operation which offers a base for memory operation.

The charge storage sections include at least a film or region capable of holding electric charge, accumulating and holding electric charge, or trapping electric charge. Materials offering these capabilities include silicon nitrides; silicon and other semiconductors; silicate glasses containing impurities, such as phosphor or boron; silicon carbide; alumina; high dielectrics, such as hafnium oxide, zirconium oxide, tantalum oxide, and yttrium oxide; zinc oxides, aluminum oxides; and metal and other conductors. The charge storage sections may be either single or multilayer structure, each layer being made from, for example, an insulator film including insulating films having a charge storing function, such as silicon nitride film; an insulator film including a conductive film or a semiconductor layer therein; or an insulator film including at least one conductor or semiconductor dot. Even in films having a charge storing function (hereinafter, "charge storing film") and regions having a charge storing function, a silicon nitride film exhibits distinct hysteresis because the film has many levels at which charge is trapped. Also, the silicon nitride film shows good storage characteristics due to its extended charge storing time and absence of charge leak paths (hence free from electric charge leaks). The film is also preferred because it is a quasi-standard material used in LSI (Large-Scale Integration) processes. Apart from the silicon nitride film, the insulating film having a charge storing function may be made of the various insulating materials (e.g., high dielectrics) listed above or a silicon oxide film into which impurities are injected. Impurities in such silicon oxide films can store charge, realizing memory effect.

The use of an insulating film, such as a silicon nitride film, which includes in it an insulating film having a charge storing function as the charge storage sections provides storage capabilities with improved reliability, because silicon nitride films and like charge storing films are insulators, and a charge leak from a part of the film does not easily lead to the loss of the whole charge of the film. Further, where multiple memory elements (semiconductor memories) are packed so closely that adjacent charge storage sections come in contact, the charge storage sections made of an insulator will retain individual information, while the charge storage sections made of a conductor will lose it. Besides, contact plugs can be placed closer to the charge storage sections, and in some cases overlap the charge storage sections, allowing for further memory element miniaturization.

To further improve reliability in storage capabilities, the insulating film having a charge storing function does not need to be in the form of film. It is preferred if insulators having a charge storing function are scattered in the insulating film, specifically, dispersed in dots in a material, e.g., a silicon oxide, which is hardly charged.

The use of an insulator film including a conductive film or a semiconductor layer therein as the charge storage sections enables charges injected into the conductor or semiconductor to be controlled freely in terms of charge levels. This facilitates memory operation involving three or more states. The semiconductor layer for use with the charge storage sections is preferably made from a polysilicon film.

The use of an insulator film containing one or more conductor or semiconductor dots as the charge storage sections facilitates writing and erasure through direct charge tunneling, cutting down on power consumption. An example of an insulator film containing one or more conductor or semiconductor dots is an insulating film containing silicon fine particles therein.

The charge storage sections preferably include, in addition to the charge storing film, regions which prevents charge from leaking from the charge storing film or a film having a function which prevents charge from leaking from the charge storing film. Examples include silicon oxide films, aluminum oxide films, and other like insulating films.

The charge storage sections are located on both sides of the gate electrode, either directly or with an intervening insulating film. The charge storage sections are provided on the semiconductor substrate (well region, body region, source/drain regions, diffusion layer regions), either directly, with an intervening gate insulating film, or with an intervening insulating film. The charge storing film on both sides of the gate electrode may be formed to entirely or partly cover the side walls of the gate electrode, either directly or with intervening insulating film. When a conductive film is used as the charge storing film, there is preferably provided an intervening insulating film so that the charge storing film does not come in direct contact with the semiconductor substrate (well region, body region, source/drain regions, or diffusion layer regions) or gate electrode. Examples include structures in which the conductive film is stacked on/under the insulating film, the conductive film is dispersed forming dots in the insulating film, and the conductive film is located in part of the side wall insulating film on the side wall of the gate.

The charge storage sections preferably has a sandwich structure where a first insulating film and a second insulating film sandwich a film (charge storing film) made of a material having a charge storing function. In this sandwich structure, the material having a charge storing function is provided in the form of film, and therefore capable of quickly increasing its charge density and producing uniform charge density upon injection of electric charges. If the material has a non-uniform charge distribution, a flow of charge can occur in a first insulator while it is holding charge, which will diminishes the reliability of the memory element. The charge storing film is separated from the conductor section (gate electrode, diffusion layer regions, semiconductor substrate) by the first and second insulating films. This restrains charge leaks from the charge storing film, providing a sufficient storage time. For these reasons, with the sandwich structures, the semiconductor memory ensures high speed rewriting, improved reliability, and a sufficient storage time.

In the sandwich structure, the material having a charge storing function is preferably a different insulator from the constituent insulators of the first insulating film and the second insulating film. In other words, the charge storage sections preferably has a sandwich structure in which the film composed of the first charge-storing insulator is sandwiched between a film composed of a second insulator (different from the first insulator) and a film composed of a third insulator (different from the first insulator). In the sandwich structure, the first charge-storing insulator is provided in the form of film, and therefore capable of quickly increasing its charge density and producing uniform charge density upon injection of electric charges. If the first insulator has a non-uniform charge distribution, a flow of charge can occur in the first insulator while it is holding charge, which will diminish the reliability of the memory element. The first charge-storing insulator is separated from the conductor section (gate electrode, diffusion layer regions, semiconductor substrate) by another insulating film. This restrains charge leaks from the first insulator, providing a sufficient storage time. For these reasons, with the sandwich structure, the semiconductor memory ensures high speed rewriting, improved reliability, and a sufficient storage time. The charge storage sections meeting these conditions is especially preferably such that the first insulator is a silicon nitride film, and the second and third insulators are silicon oxide films. A silicon nitride film exhibits distinct hysteresis because the film has many levels at which charge is trapped. Also, both silicon oxide films and silicon nitride films are preferred because quasi-standard material used in LSI processes. Apart from silicon nitride, the first insulator may be made of, for example, hafnium oxide, tantalum oxide, or yttrium oxide. Apart from silicon oxides, the second and third insulators may be made of, for example, aluminum oxide. The second and third insulators may be made of either different or identical materials.

In the sandwich structure, when the film made of the first charge-storing insulator is a silicon nitride film, the silicon nitride film preferably has a thickness of 2 nm to 15 nm. Such thicknesses restrain variations from one element to another, increasing the number of possible rewrites. In the sandwich structure, when the films made of the second and third insulators are silicon oxide films, the silicon oxide film preferably have a thickness of 1.5 to 10 nm. Such thicknesses restrain electric charge caught in the first insulator from tunneling through the silicon oxide film and scattering. This improves information storage characteristics.

The charge storage sections are located on both sides of the gate electrode. The charge storage section are provided on the semiconductor substrate (well region, body region, source/drain regions, or diffusion layer regions).

A charge storing film is provided in each charge storage section on the sides of the gate electrode, either directly or with an intervening insulating film. The charge storing film is provided on the semiconductor substrate (well region, body region, source/drain regions, or diffusion layer regions) either directly, with an intervening gate insulating film, or with an intervening insulating film. The charge storing films on both sides of the gate electrode are preferably formed to entirely or partly cover the side walls of the gate electrode, either directly or with an intervening insulating film. As an application example, when the gate electrode has a concave at its foot, the charge storing films may be formed to entirely or partly fill in the concave either directly or with an intervening insulating film.

The gate electrode is preferably formed only on the side walls of the charge storage sections or not to cover the top of the charge storage sections. The layout enables contact plugs to be located even closer to the gate electrode, allowing for further memory element miniaturization. Besides, with such a simple layout, the memory element is easy to manufacture and shows an improved yield.

The source/drain regions are diffusion layer regions of an opposite conduction type to the semiconductor substrate or the well region, and located opposite to the gate electrode from the charge storage sections respectively. The junction of the source/drain regions and the semiconductor substrate or well region preferably shows a steep transition in the concentration of impurities. The steep transition in the concentration creates a steep transition in potential at the junction. Hot electrons and hot holes (holes) occur efficiently at low voltages. This enables high speed operation at lower voltages.

The junction depth in the source/drain regions is not limited in any particular manner and can be adjusted where necessary in accordance with, for example, the desired performance of the semiconductor memory. When an SOI substrate is used as the semiconductor substrate, the source/drain regions may have a less junction depth than the thickness of the surface semiconductor layer. It is however preferred if the junction depth in the source/drain regions is substantially equal to the thickness of the surface semiconductor layer.

The source/drain regions may be formed to extend below the gate electrode or to "offset" from the gate electrode (extend short of below the gate electrode). The latter is preferred because when voltage is applied to the gate electrode, the likelihood that the offset regions under the charge storing film invert changes greatly with the charge stored in the charge storage sections, which generates rich memory effects and reduces short channel effects. Too much offsetting vastly lowers the drive current between the source and drain, therefore, it is preferred if the offset, that is, the distance, as measured in the gate length direction, from one of the sides of the gate electrode to either the source or drain region whichever is closer is shorter than the thickness of the charge storing film as measured parallel to the gate length direction. Especially important is the overlapping of at least part of a charge storage region in the charge storage sections and part of the source/drain regions which are diffusion layer regions, because the nature of the memory element which is a semiconductor memory in accordance with the present invention is found where records are rewritten by the gate electrode which exists only on the side walls of the charge storage sections and an electric field intersecting the charge storage sections which is caused by the potential difference between the source/drain regions.

The source/drain regions may partly extend above the channel region surface, that is, higher than the bottom face of the gate insulating film. When this is the case, appropriately, a conductive film is provided to sit on the source/drain regions in the semiconductor substrate, forming an integral part of the source/drain regions. The conductive film is made of, for example, polysilicon, amorphous silicon, or a similar semiconductor; silicide, one of the aforementioned metals, or high melting point metal. Polysilicon is preferred among these examples. Polysilicon has a much greater impurity diffusion rate than the semiconductor substrate, because it is easy to form a small junction depth in the source/drain regions in the semiconductor substrate, which makes it easier to restrain short channel effects. When-this is the case, it is preferred if the gate electrode and part of the source/drain regions are arranged to sandwich at least part of the charge storing film.

In the semiconductor memory in accordance with the present invention, predetermined potentials are applied respectively to the four terminals (the gate electrode on the gate insulating film, the source region, the drain region, and the semiconductor substrate) to write, erase, and read data.

Specific examples of the operation principles and operating voltage will be given later. Semiconductor memories in accordance with the present invention, when arranged to form a memory cell array, can be controlled through a single control gate. The configuration requires a reduced number of word lines.

The semiconductor memory in accordance with the present invention can be fabricated by the same method as, for example, the method by which side wall spacers of a layered structure are formed on a side wall of a gate electrode in an ordinary semiconductor process. Specifically, after a gate electrode is formed, a multilayer film is formed primarily consisting of the first insulating film (film made of the second insulator), the charge storing film (charge retaining film; for example, film made of the first insulator), and the second insulating film (film made of the third insulator). The multilayer film is etched under appropriate conditions to leave the layers as side wall spacers. The conditions and deposits in the side wall formation are selected as necessary in accordance with the desired structure of the charge storage sections.

The semiconductor memory in accordance with the present invention is applicable to battery-operated mobile electronics, especially, mobile data terminals. Mobile electronics include mobile data terminals, mobile phones, and game machines.

The following will be described in detail the semiconductor memory in accordance with the present invention with reference to drawings.

Embodiment 1

Figure 2:
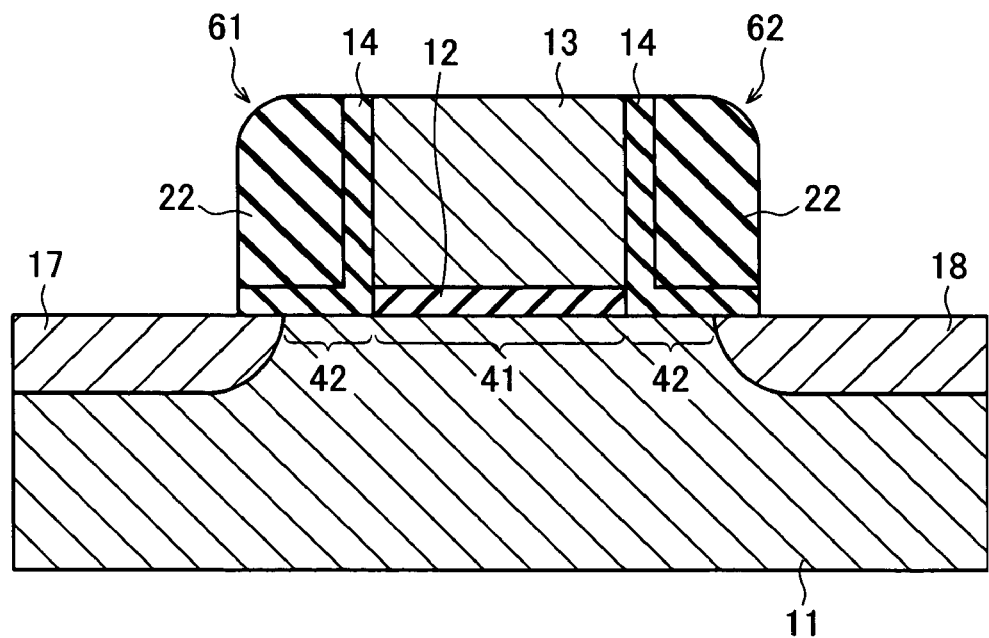
FIG. 2 is a schematic cross-sectional view of a major part of a second example of a semiconductor memory in accordance with the first embodiment of the present invention.
Figure 3:
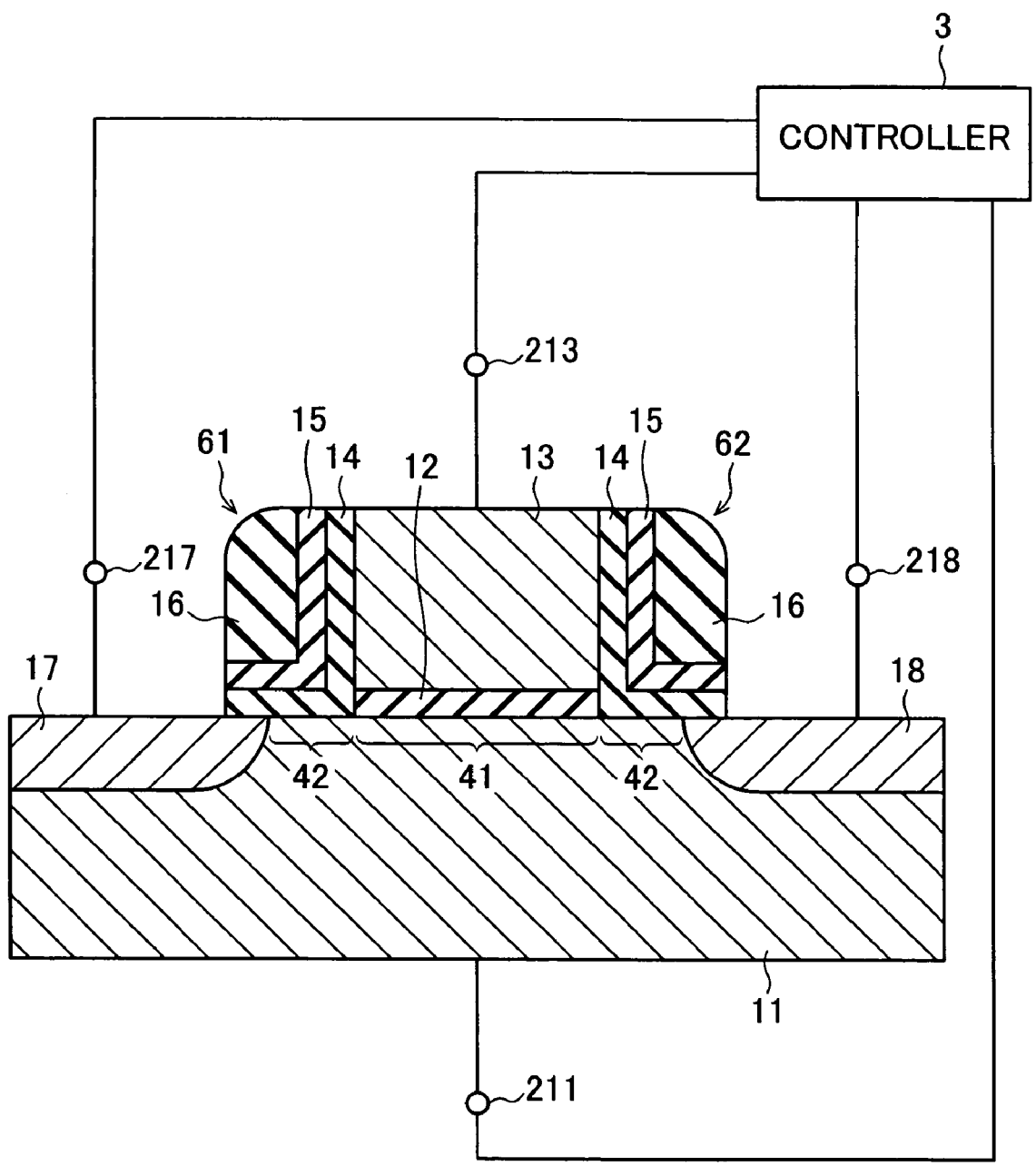
FIG. 3 is a schematic cross-sectional view of a major part of a third example of a semiconductor memory in accordance with the first embodiment of the present invention.

Referring to FIG. 1 to FIG. 3, the structure of a memory element which is a semiconductor memory in accordance with the present embodiment will be described. FIG. 1 to FIG. 3 are schematic cross-sectional views of the memory element and show different side wall spacer shapes in the charge storage section structure.

A memory element constituting the semiconductor memory in accordance with the present embodiment is an involatile memory cell capable of storing 2 bits of data. As shown in FIG. 1 to FIG. 3, the semiconductor memory includes a gate electrode 13 formed on a semiconductor substrate 11 with an intervening gate insulating film 12. The electrode 13 has substantially the same gate length as ordinary transistors. On the side walls of the gate insulating film 12 and the gate electrode 13, there are provided charge storage sections 61, 62 shaped like side wall spacers. Opposite to the gate electrode 13, the charge storage sections 61, 62 have a first diffusion layer region 17 and a second diffusion layer region 18 (source/drain regions) respectively. PN junctions are formed between the semiconductor substrate 11 and the first and second diffusion layer regions 17, 18. The source/drain regions 17, 18 "offset" with respect to the sides of the gate electrode 13 (from a region 41 over which the gate electrode 13 sits).

The first diffusion layer region 17 and the second diffusion layer region 18 are formed near the surface of the semiconductor substrate 11 on which is provided the gate electrode 13 to avoid the region 41 below the gate electrode 13. Thus, a channel region is formed between the diffusion layer regions 17, 18 near the surface of the semiconductor substrate 11. The channel region is present not only in the region 41 below the gate electrode 13, but also in regions outside gate insulating films 14 (offset regions 42). In other words, the channel region between the first diffusion layer region 17 and the second diffusion layer region 18 extends below the charge storage sections 61, 62.

The charge storage section 61 is provided opposite to an end and its proximity of the first diffusion layer region 17 near the gate insulating film 12. The charge storage section 62 is provided opposite to an end and its proximity of the second diffusion layer region 18 near the gate insulating film 12. As discussed in the foregoing, the charge storage sections 61, 62 of the memory transistor are formed independently from the gate insulating film 12. Therefore, the memory functions performed by the charge storage sections 61, 62 are separate from the transistor operation functions performed by the gate insulating film 12. In addition, the two charge storage sections 61, 62 on the sides of the gate electrode 13 are separated from each other by the gate electrode 13; interference of the sections 61, 62 with each other is effectively restrained in rewriting. Therefore, the memory transistor is capable of holding 2 bits of data and easy to miniaturize.

The first and second diffusion layer regions (source/drain regions) 17, 18 are formed to offset with respect to the gate electrode 13, so that when voltage is applied to the gate electrode 13, the likelihood that the offset regions 42 under the charge storage sections 61, 62 invert changes with the charge stored in the charge storage sections 61, 62. This allows improved memory effects. Further, when compared to ordinary logic transistors, short channel effects are better prevented and the gate length can be further reduced. In addition, the arrangement is suitable in terms of structure in restraining short channel effects, and therefore can employ a thicker gate insulating film than the logic transistor. This allows another improvement to the reliability.

The charge storage sections shaped like side wall spacers may be constructed of, for example, a silicon nitride film 21 shaped like a side wall and a silicon oxide film 14 separating the silicon nitride film 21 from the gate electrode 13, the semiconductor substrate 11, and the first and second diffusion layer regions (source/drain regions) 17, 18 as in FIG. 1. It is the silicon nitride film 21 that functions to store electric charges (electrons or holes). The silicon oxide film 14 prevents leaks of charges stored in the silicon nitride film 21.

Another example of the charge storage sections is shown in FIG. 2, where the charge storage sections are constructed of a conductor film 22 shaped like a side wall and a silicon oxide film 14 separating the conductor film 22 from the gate electrode 13, the semiconductor substrate 11, and the first and second diffusion layer regions (source/drain regions) 17, 18. It is the conductor film 22 that functions to store electric charges. The silicon oxide film 14 prevents leaks of electric charges stored in the conductor film 22.

Alternatively, the charge storage sections may be constructed as shown in FIG. 3, where the charge storage sections shaped like side wall spacers are constructed of a silicon nitride film 15 sandwiched between silicon oxide films 14, 16. The silicon nitride films 15 traps electric charges (electrons or holes) to store them therein. Charges are primarily stored in that parts of the silicon nitride film 15 which is above the offset regions 42. As discussed in the foregoing, the charge storage sections are constructed of the silicon nitride film 15 sandwiched by the silicon oxide films 14, 16; therefore, charge injection efficiency into the charge storage sections is improved, and rewrite operation (write and erase operation) is done quickly.

In the memory element in FIG. 3, there is provided a terminal 211 to apply voltage to the semiconductor substrate 11 (regions except for the first diffusion layer region 17 and the second diffusion layer region 18). Also, terminals 217, 218 are provided to apply voltage respectively to the first diffusion layer region 17 and the second diffusion layer region 18. Further, a terminal 213 is provided to apply voltage to the gate electrode 13.

In the memory element in FIG. 3, there is provided a controller 3 which controls write, read, and erase operations in memory elements (detailed later). Therefore, the controller 3 regulates the levels and timings of the voltages applied to the terminals 211, 213, 217, 218.

The memory elements in figures other than FIG. 3 also have terminals and a controller functioning (not shown) similarly to the terminals 211, 213, 217, 218 and the controller 3.

The structure of the charge storage sections is not limited to these three examples (FIG. 1 to FIG. 3). For example, the charge storage sections may have quantum dots capable of storing electric charges. In addition, the charge storage sections are not necessarily shaped like a side wall; they only need to be present on both sides of the gate electrode, and partly in contact with the semiconductor substrate 11 and the first and second diffusion layer regions (source/drain regions) 17, 18.

Figure 6:
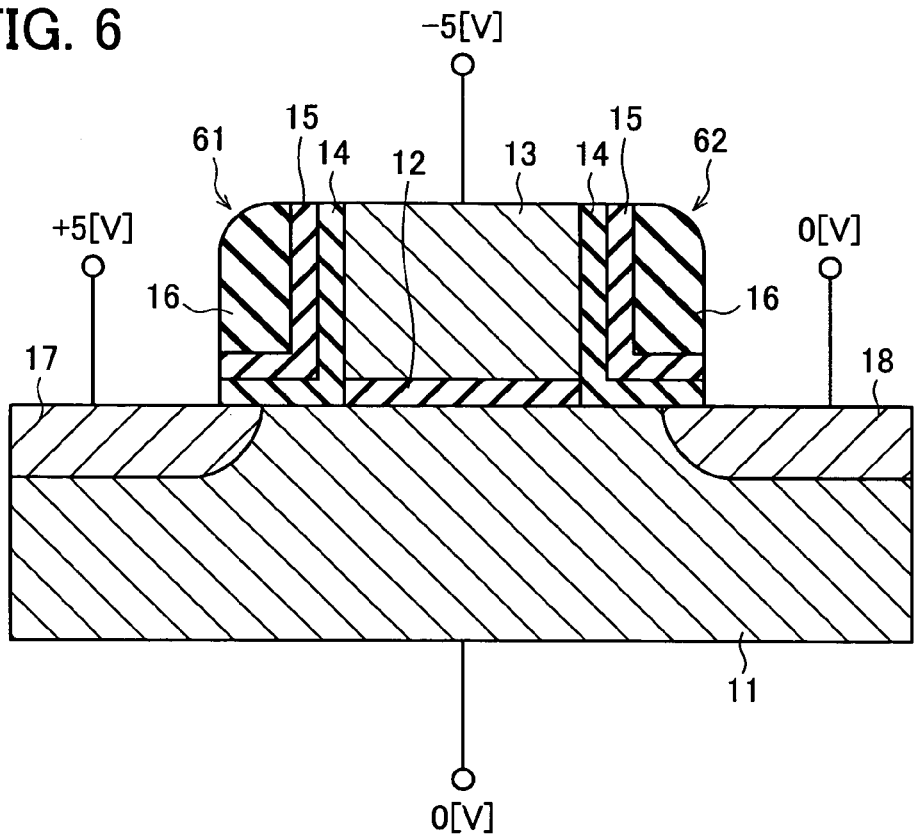
FIG. 6 is a schematic cross-sectional view of a major part illustrating a first erase operation of a semiconductor memory in accordance with the present invention.

Next, the operation principles of the memory element will be described in reference to FIG. 4(*a*) to FIG. 6. Although FIG. 4(*a*) to FIG. 6 show a memory element with the charge storage sections illustrated in FIG. 3, the description holds true with memory elements with charge storage sections shaped otherwise. When the memory element is of the n-channel type, the semiconductor substrate 11 is of the p type, and the diffusion layer regions 17, 18 are of the n type. When the memory element is of the p-channel type, the conduction types are reversed. The following explanation (including read and erase methods) will assume that the memory element is of the n-channel type. In the case of the p-channel type, the roles of electrons and holes are reversed. In addition, in the case of the p-channel type, the voltages applied to the nodes are all reversed in terms of polarity.

First, a first write method for the memory element will be described in reference to FIG. 4(*a*) and FIG. 4(*b*). "Write" refers to injection of electrons to the charge storage sections when the memory element is of the n-channel type, and to injection of holes to the charge storage sections when the memory element is of the p-channel type.

The first write method for the memory is done by injecting electrons accelerated in a drain electric field into the charge storage sections.

Figure 4:
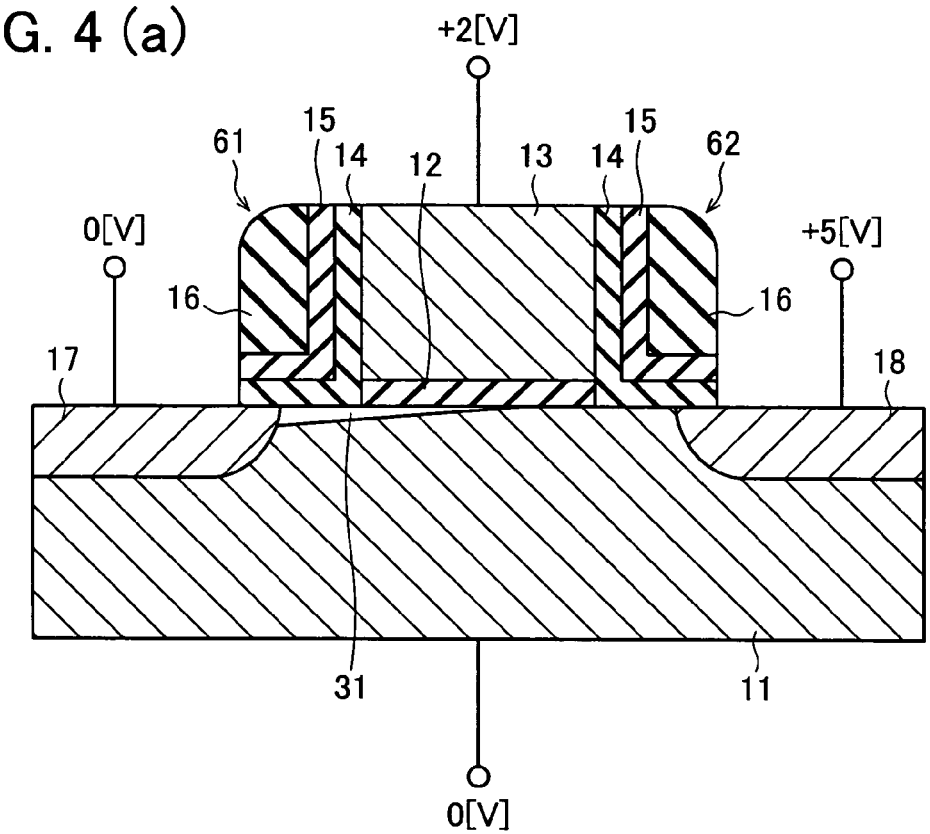
FIGS. 4(a), 4(b) are schematic cross-sectional views of a major part illustrating a first write operation of a semiconductor memory in accordance with the present invention.
Figure 4:
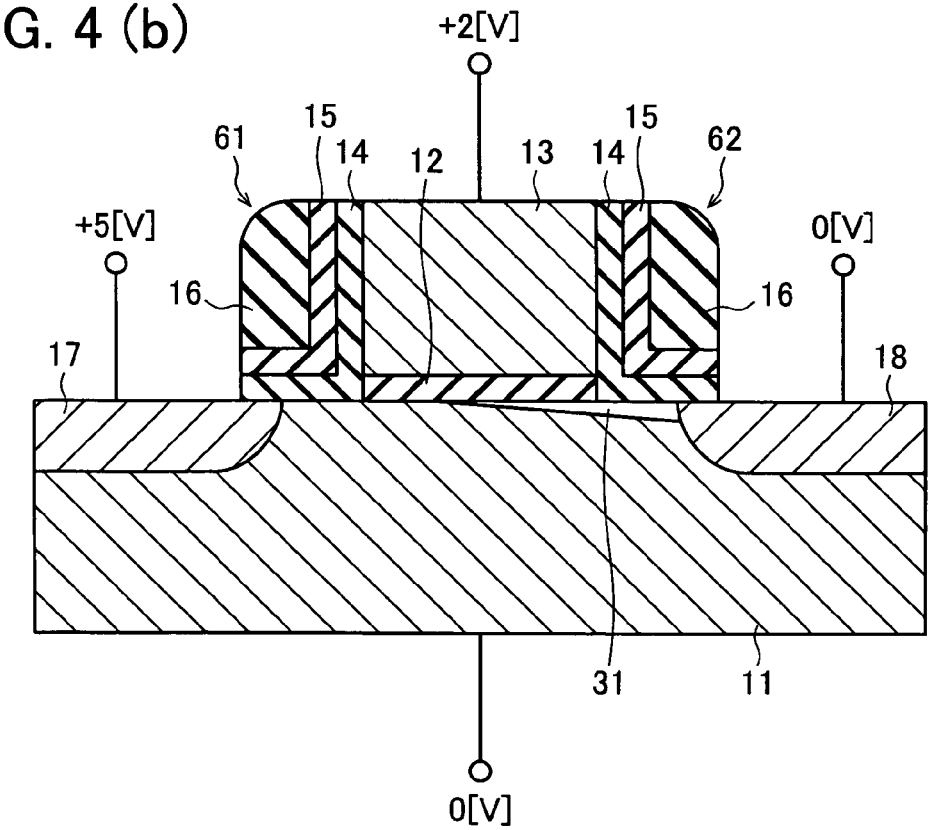

To inject electrons to the second charge storage section 62 (write), the first diffusion layer region 17 is used as a source electrode, and the second diffusion layer region 18 as a drain electrode, as shown in FIG. 4(*a*). For example, 0 V is applied to the first diffusion layer region 17 and the semiconductor substrate 11, +5 V to the second diffusion layer region 18, and +2 V to the gate electrode 13. Under the voltage conditions, although an inversion layer 31 extends from the first diffusion layer region 17 (source electrode), but not reaching the second diffusion layer region 18 (drain electrode). So a pinch-off point occurs. Electrons are accelerated from the pinch-off point to the second diffusion layer region 18 (drain electrode) by the drain electric field and injected to the second charge storage section 62 (more precisely, the silicon nitride film 15 in the second charge storage section 62) to write data. In the proximity of the first charge storage section 61, no data is written because no electrons are accelerated by the drain electric field. The voltages in write operation is not limited these values. For example, 0 V may be applied to the first diffusion layer region 17 and the semiconductor substrate 11, +10 V to the second diffusion layer region 18, and +5 V to the gate electrode 13, in which case hot electrons are injected to the second charge storage section 62 to write data.

In this manner, data can be written by injecting electrons to the second charge storage section 62.

Meanwhile, to inject electrons to the first charge storage section 61 (write), the second diffusion layer region 18 is used as a source electrode (source region), and the first diffusion layer region 17 as a drain electrode (drain region), as shown in FIG. 4(*b*). For example, 0 V is applied to the second diffusion layer region 18 and the semiconductor substrate 11, +5 V to the first diffusion layer region 17, and +2 V to the gate electrode 13. As discussed in the foregoing, the source electrode and the drain electrode are reversed when compared to a case where electrons are injected to the second charge storage section 62, so that electrons are injected to the first charge storage section 61 to write data.

Next, a second write method for the memory element will be described in reference to FIG. 5(*a*) and FIG. 5(*b*).

To inject electrons to the second charge storage section 62 (write) by the second write method, the first diffusion layer region 17 is used as a source electrode, and the second diffusion layer region 18 as a drain electrode, as shown in FIG. 5(*a*). What is unique about the second write method is that the semiconductor substrate 11 has a lower potential than the first diffusion layer region 17. For example, 0 V is applied to the first diffusion layer region 17, −2 V to the semiconductor substrate 11, +3 V to the second diffusion layer region 18, and +2 V to the gate electrode 13. In other words, one of the n-type diffusion layer regions (the first diffusion layer region 17) is set to a reference voltage, whereas the other n-type diffusion layer region (second diffusion layer region 18) is set higher than the reference voltage, the gate electrode 13 higher than the reference voltage, and the p-type semiconductor substrate (semiconductor substrate 11) lower than the reference voltage. The voltages applied to the nodes are relative: if the semiconductor substrate 11 is set to a reference voltage (0 V), these conditions are equivalent to a case where the second diffusion layer region 18 is set to +5 V, the first diffusion layer region 17 to +2 V, and the gate electrode 13 to +4 V. The case may be described as follows: The p-type semiconductor substrate (semiconductor substrate 11) is set to a reference voltage, whereas one of the n-type diffusion layer regions (the first diffusion layer region 17) is set higher than the reference voltage, the other n-type diffusion layer region (second diffusion layer region 18), and the gate electrode 13 higher than the one of the n-type diffusion layer regions. The potentials provided to the nodes are not limited to these examples. Their optimal values depend on the structure and other factors of the memory element. In addition, the potential of the gate electrode 13 and the second diffusion layer region 18 must be higher than that of the first diffusion layer region 17. However, it does not matter whether the potential of the gate electrode 13 is higher or lower than the potential of the second diffusion layer region 18.

When semiconductor memories in accordance with the present embodiment are arrayed to form a cell array, preferably, the memory elements share a common p-type semiconductor substrate (in other words, the memory cell array is formed on a single semiconductor substrate or a common p-type well region is provided in the semiconductor substrate, with a memory cell array formed on that p-type well region), to fix the potential of the p-type semiconductor substrate for operation, because the common p-type semiconductor substrate has a PN junction having a very large area, and a change in the potential of the p-type semiconductor substrate therefore causes a large electric current flow to charge the capacitance related to the PN junction.

The second write method writes data at a much less current than the first write method. In other words, the second write method has a much better charge injection efficiency than the first write method. Table 1 shows the electric current from the first diffusion layer region 17 to the second diffusion layer region 18 in write operation by the first and second write methods in a memory element having a gate length of 0.24 µm and a gate width of 1 µm.

TABLE 1

| Operating method | First write operation | Second write operation |
| --- | --- | --- |
| Write current | 260 [µA] | 2 [µA] |

As is obvious from these experimental results, the electric current in the second write method is reduced to 1/100 or less of the electric current in the first write method.

Meanwhile, to inject electrons to the first charge storage section 61 (write), the second diffusion layer region 18 is used as a source electrode, and the first diffusion layer region 17 as a drain electrode, as shown in FIG. 5(b). For example, 0 V is applied to the second diffusion layer region 18, −2 V to the semiconductor substrate 11, +3 V to the first diffusion layer region 17, and +2 V to the gate electrode 13. As discussed in the foregoing, the source electrode and the drain electrode are reversed when compared to a case where electrons are injected to the second charge storage section 62, so that electrons are injected to the first charge storage section 61 to write data.

According to the second write method, electron can be injected selectively into desired charge storage sections at a very high efficiency. Therefore, the write electric current levels, hence the power consumption in the semiconductor memory, can be vastly reduced.

Next, the read operation principles of the memory element (not shown) will be explained. To read information stored in the first charge storage section 61, the first diffusion layer region 17 is used as a source electrode, and the second diffusion layer region 18 as a drain electrode, while the transistor is caused to operate in the saturation region. For example, 0 V is applied to the first diffusion layer region 17 and the semiconductor substrate 11, +2 V to the second diffusion layer region 18, and +1 V to the gate electrode 13. In the application, if the first charge storage section 61 has no electron storage, a drain current flow is likely to occur. In contrast, if the first charge storage section 61 has electron storage, an inversion layer is not likely to form in the proximity of the first charge storage section 61; therefore, a drain current flow is not likely to occur. Therefore, by detecting a drain current, the information stored in the first charge storage section 61 can be read. In the reading, the presence/absence of stored electric charges in the second charge storage section 62 does not affect the drain current, because the proximity of the drain is pinched off.

To read information stored in the second charge storage section 62, the second diffusion layer region 18 is used as a source electrode, and the first diffusion layer region 17 as a drain electrode, while the transistor is caused to operate in a saturation region. For example, 0 V is applied to the second diffusion layer region 18 and the semiconductor substrate 11, +2 V to the first diffusion layer region 17, and +1 V to the gate electrode 13. As discussed in the foregoing, the source electrode and the drain electrode are reversed when compared to a case where information stored in the first charge storage section 61 is read, so as to read the information stored in the second charge storage section 62.

If the gate electrode 13 does not completely cover the channel region (offset regions 42), the inversion layer either disappears or forms in the channel region not covered by the gate electrode 13 depending on the presence/absence of excess electrons in the charge storage sections 61, 62. A result is a large hysteresis (change of threshold value). If the offset region 42 has too great a width, the drain current, hence the read rate, drops greatly. Therefore, it is preferred if the width of the offset region 42 is determined in order to achieve sufficiently hysteresis and read rate.

Even if the diffusion layer regions 17, 18 have reached the sides of the gate electrode 13, that is, the diffusion layer regions 17, 18 extends below the gate electrode 13, the threshold value of the transistor changes little in write operation. Parasitic resistance at source/drain ends however changes greatly, with the drain current showing a large drop (by more than one order of magnitude). Therefore, data can be read by detecting the drain current, achieving a function as a memory. To achieve greater memory hysteresis effects, the gate electrode 13 preferably does not overlap the diffusion layer regions 17, 18 (offset regions 42 provided).

Next, a first erase method for the semiconductor memory will be described in reference to FIG. 6. To erase information stored in the second charge storage section 62, a positive voltage (e.g., +5 V) is applied to the second diffusion layer region 18, and 0 V to the semiconductor substrate 11 to reverse bias the PN junction between the second diffusion layer region 18 and the semiconductor substrate 11. Further, a negative voltage (e.g., −5 V) is applied to the gate electrode 13. Under these circumstances, the transition of potential is steep at the PN junction, especially, near the gate electrode 13, due to the effect from the gate electrode to which a negative voltage is applied. Thus, holes occur in the semiconductor substrate 11 side of the PN junction due to inter-band tunneling. These holes are pulled toward the gate electrode 13 having a negative potential. As a result, holes are injected to the second charge storage section 62. In this manner, data is erased from the second charge storage section 62. To this end, either 0 V is applied to the first-diffusion layer region 17 or the first diffusion layer region 17 is set to an open state.

To erase information stored in the first charge storage section 61 by the erase method, the potential of the first diffusion layer region 17 and the potential of the second diffusion layer region 18 are reversed.

Figure 7:
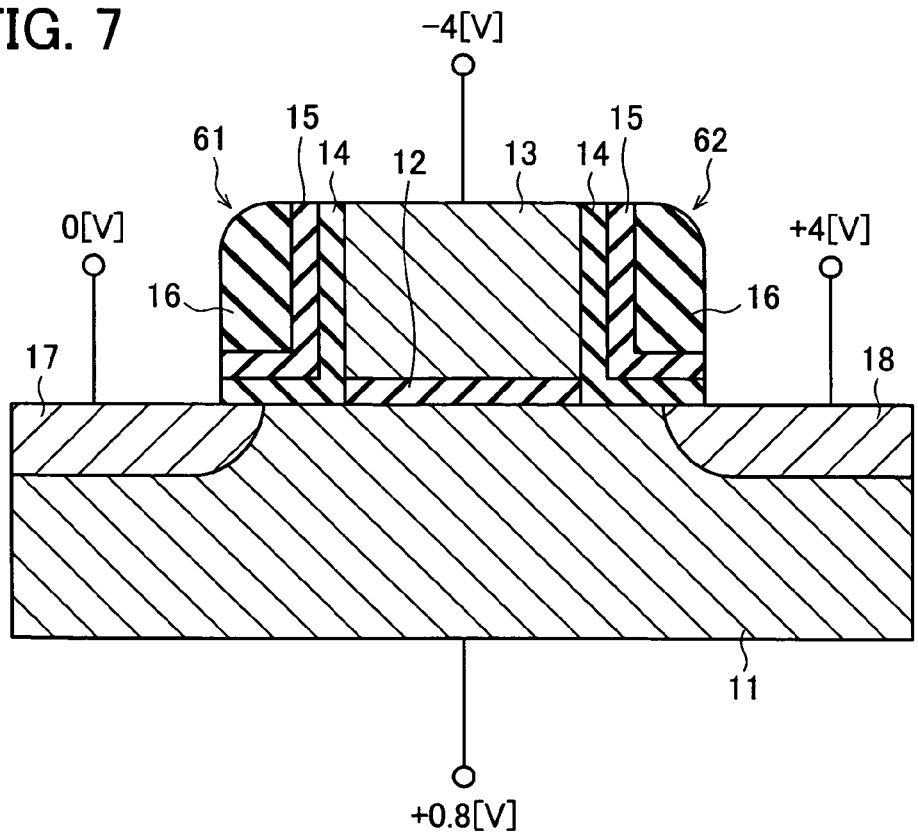
FIG. 7 is a schematic cross-sectional view of a major part illustrating a second erase operation of a semiconductor memory in accordance with the present invention.

Next, a second erase method for the semiconductor memory will be described in reference to FIG. 7. To erase information stored in the second charge storage section 62, as shown in FIG. 6, a positive voltage (e.g., +4 V) is applied to the second diffusion layer region 18, 0 V to the first diffusion layer region 17, a negative voltage (e.g., −4 V) to the gate electrode 13, and a positive voltage (e.g., +0.8 V) to the semiconductor substrate 11. In other words, one of the n-type diffusion layer regions (the first diffusion layer region 17) is set to a reference voltage, whereas the other n-type diffusion layer region (second diffusion layer region 18) is set higher than the reference voltage, the gate electrode 13 lower than the reference voltage, and the p-type semiconductor substrate (semiconductor substrate 11) higher than the reference voltage. The voltages applied to the nodes are relative; if the semiconductor substrate 11 is set to a reference voltage (0 V), these conditions are equivalent to a case where the second diffusion layer region 18 is set to +3.2 V, the first diffusion layer region 17 to −0.8 V, and the gate electrode 13 to −4.8 V. The case may be described as follows: The p-type semiconductor substrate (semiconductor substrate 11) is set to a reference voltage, whereas one of the n-type diffusion layer regions (the first diffusion layer region 17) is set lower than the reference voltage, the other n-type diffusion layer region (second diffusion layer region 18) higher than the reference voltage, and the gate electrode 13 lower than the reference voltage.

When semiconductor memories in accordance with the present embodiment are arrayed to form a cell array, preferably, the memory elements share a common p-type semiconductor substrate (in other words, the memory cell array is formed on a single semiconductor substrate or a common p-type well region is provided in the semiconductor substrate, with a memory cell array formed on that p-type well region), to fix the potential of the p-type semiconductor substrate for operation, because the common p-type semiconductor substrate has a PN junction having a very large area, and a change in the potential of the p-type semiconductor substrate therefore causes a large electric current flow to charge the capacitance related to the PN junction.

According to the second erase method, holes occur, enabling erase operation, even if reverse bias applied to the second diffusion layer region 18 and the semiconductor substrate 11 are relatively small. Therefore, the operating voltage of the memory element can be reduced. Therefore, power consumption can be lowered, and degradation of the memory element can be restrained. Especially, in the presence of the offset regions 42, the effect that the potential of the PN junction becomes sharp due to a gate electrode to which a negative potential is applied is small, so that holes are unlikely to occur from inter-band tunneling. The second erase method however compensates for that shortcoming, realizing erase operation at low voltages. For these reasons, the second erase method is especially preferred in memories in accordance with the present invention where memory effects are improved by the provision of the offset regions 42.

According to the semiconductor memory in accordance with the present embodiment, the charge storage sections 61, 62 in the memory transistor are formed on both sides of the gate electrode 13, independently from the gate insulating film 12. This enables 2 bit operation. Further, since the charge storage sections 61, 62 are separated from each other by the gate electrode 13; interference of the sections 61, 62 with each other is effectively restrained in rewriting. In addition, the memory functions performed by the charge storage sections 61, 62 are separate from the transistor operation functions performed by the gate insulating film 12; the thickness of the gate insulating film 12 can be reduced to restrain short channel effects. This facilitates miniaturization of the element.

In addition, according to the second erase method for the semiconductor memory, holes can occur at relatively low voltages, enabling erase operation. Therefore, the operating voltage of the memory element can be reduced. Therefore, power consumption can be lowered, and degradation of the memory element can be restrained. Further, the second erase method produces an especially large erase operation voltage lowering effect in memories in accordance with the present invention where memory effects are improved by the offset of the diffusion layer regions 17, 18 with respect to the gate electrode 13.

Embodiment 2

A semiconductor memory in accordance with the embodiment relates to, in the semiconductor memory in accordance with the first embodiment, preferable positional relationship between the charge storage sections and the diffusion layer regions and a preferable structure of the charge storage sections.

Figure 8:
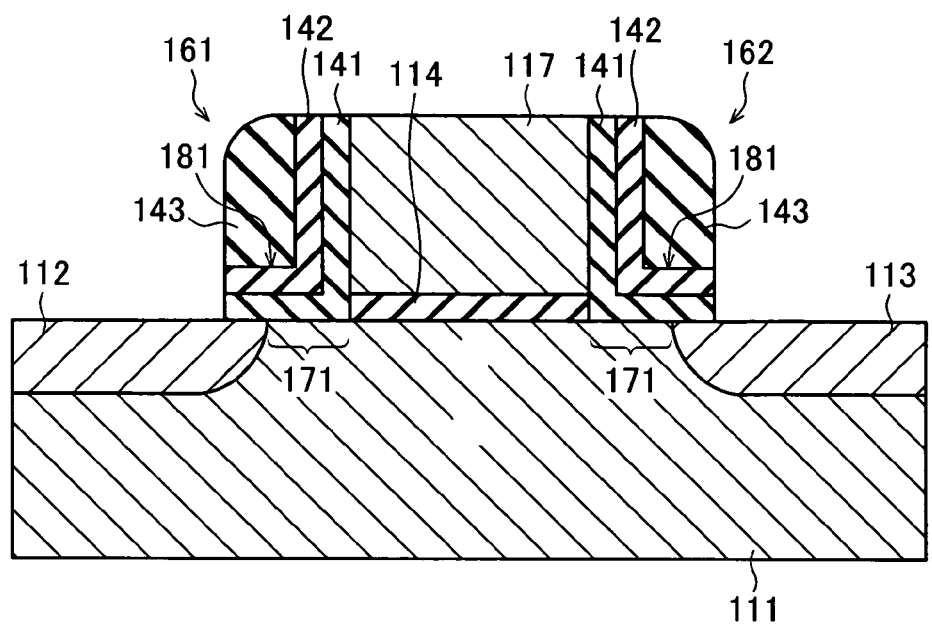
FIG. 8 is a schematic cross-sectional view of a major part of a semiconductor memory in accordance with a second embodiment of the present invention.

The semiconductor memory in accordance with the embodiment includes, as shown in FIG. 8, charge storage sections 161, 162 which have regions storing electric charge (which may be regions retaining electric charge and a film capable of storing electric charge) and regions preventing charge leaks (which may be a film preventing charge leaks). An example is the ONO structure. Specifically, a film (charge storing film) 142 made of silicon nitride as the first insulator is sandwiched between a film (first insulating film) 141 made of silicon oxides as the second insulator and a film (second insulating film) 143 made of silicon oxides as the third insulator, so as to form the charge storage sections 161, 162. Here, the silicon nitride film 142 accumulates and stores electric charges. The silicon oxide films 141, 143 prevents electric charge leaks from the silicon nitride film.

The charge storing regions (silicon nitride film 142) in the charge storage sections 161, 162 overlap diffusion layer regions 112, 113 respectively. Here, "overlap" refers to the presence of at least part of the charge storing regions (silicon nitride film 142) above at least part of the diffusion layer regions 112, 113. The semiconductor memory in accordance with the embodiment includes, similarly to the semiconductor memory in FIG. 3, a semiconductor substrate 111, a gate insulating film 114 on the semiconductor substrate 111, and a single gate electrode 117 on the gate insulating film 114. In addition, there are provided offset regions 171 (separating the gate electrode 117 from the diffusion layer regions). The top surface of the semiconductor substrate 111 under the gate insulating film 114 serves as the channel region (not shown).

Now, effects be described which are achieved by the overlapping of the charge storing region 142 in the charge storage sections 161, 162 and the diffusion layer regions 112, 113.

Figure 9:
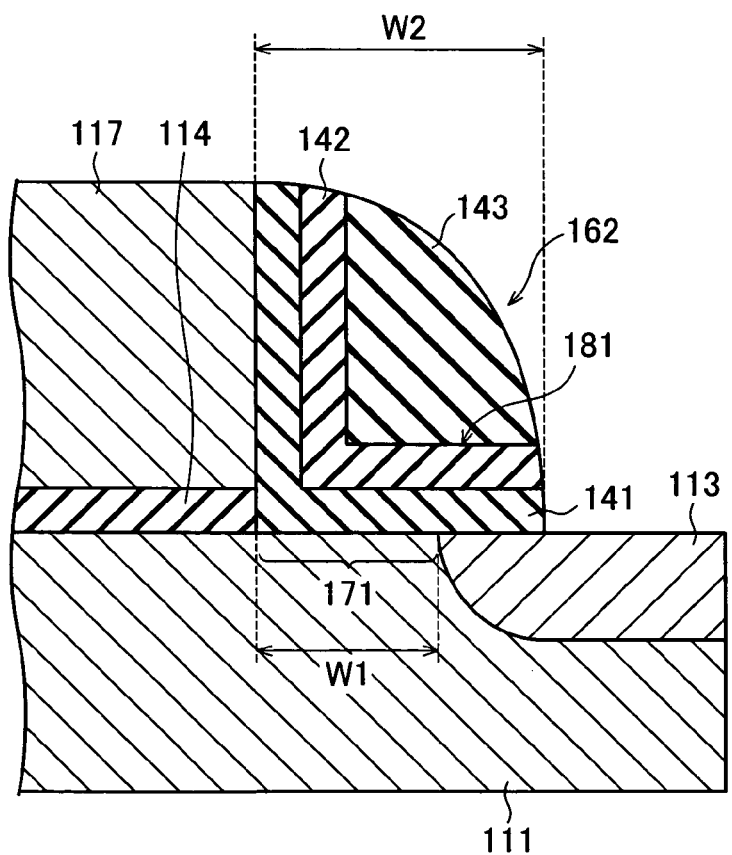
FIG. 9 is a schematic enlarged cross-sectional view of a major part of the semiconductor memory in FIG. 8.

FIG. 9 is an enlarged view of the charge storage section 162 on the right hand side of FIG. 8 and its surroundings. W1 indicates the offset between the gate electrode 117 and the diffusion layer regions 113. W2 indicates the width of the charge storage section 162 in the cross-section of the gate electrode 117 taken along the channel length. W2 is defined as the width of the charge storage section 162, because the edge of the silicon nitride film 142 opposite to the gate electrode 117 in the charge storage section 162 matches the edge of the charge storage section 162 opposite to the gate electrode 117. The overlap of the charge storage section 162 and the diffusion layer region 113 is given by W2−W1. Especially important is that in the charge storage section 162 the silicon nitride film 142 overlaps the diffusion layer region 113, that is, W2>W1.

Figure 10:
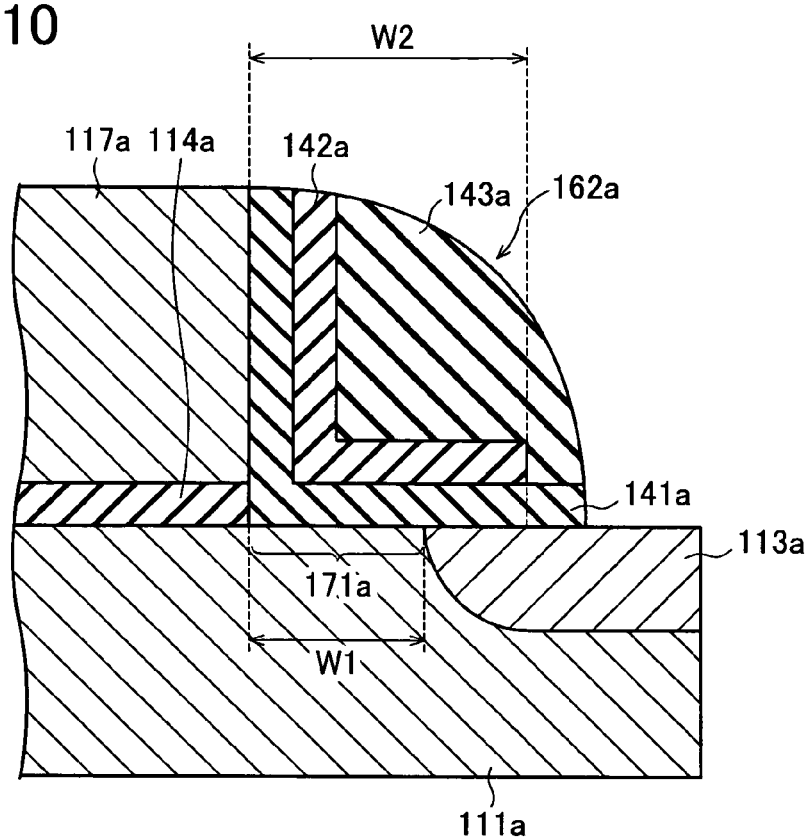
FIG. 10 is a schematic enlarged cross-sectional view of a major part of a variant of the semiconductor memory in FIG. 8.

When, as shown in FIG. 10, the edge of a silicon nitride film 142a opposite to the gate electrode 117a in a charge storage section 162a does not match the edge of a charge storage section 162a opposite to the gate electrode 117a, W2 should be defined as the distance between the edge of the gate electrode 117a to the edge of the silicon nitride film 142a opposite to the gate electrode 117a.

Figure 11:
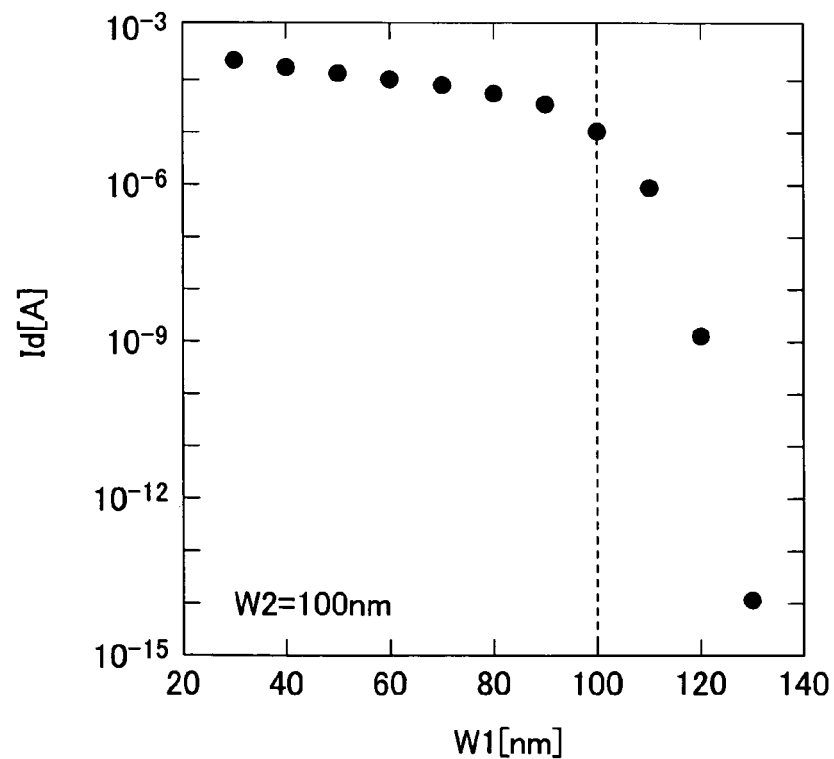
FIG. 11 is a graph showing an electrical property of a semiconductor memory in accordance with the second embodiment of the present invention.

FIG. 11 shows the drain current Id in the FIG. 9 structure, where the width W2 of the charge storage section 162 is fixed at 100 nm with the offset W1 being varied. Here, the drain current was derived by device simulation, assuming that the charge storage section 162 was in an erase state (holding holes) and the diffusion layer regions 112, 113 were used as a source electrode and a drain electrode respectively.

As is obvious from FIG. 11, at W1≧100 nm (i.e., the silicon nitride film 142 did not overlap the diffusion layer region 113), the drain current decreased rapidly. Since the drain current level is almost in proportion to the read operation rate, the memory's performance fell rapidly at W1≧100 nm. In contrast, where the silicon nitride film 142 overlapped the diffusion layer region 113, the drain current decreased gradually. Therefore, it is preferred if at least part of the silicon nitride film 142 which is a film capable of storing charge overlaps the diffusion layer regions source/drain regions 112, 113.

Based on these device simulation results, a memory cell array was fabricated, with W2 being fixed at 100 nm and W1 set to 60 nm and 100 nm as design values. When W1 was 60 nm, the silicon nitride film 142 overlapped the diffusion layer regions 112, 113 by 40 nm as a design value. When W1 was 100 nm, there was zero overlapping as a design value. Measurements of read access times of these memory cell arrays showed that the read access time was 100 times shorter when W1 was set to 60 nm as a design value. The comparison was made between the worst cases taking irregularities into account. It is preferred in practice if the read access time is 100 nanoseconds or less per bit; the prototype however turned out to be far short of meeting this requirement at W1=W2. Considering also irregularities in fabrication, it was also found that a preferred condition is W2−W1>10 nm.

To read information stored in the charge storage section 161 (region 181) in the semiconductor memories in FIGS. 8 through 10, preferably, similarly to embodiment 1, the diffusion layer region 112 is used as a source electrode, and the diffusion layer region 113 as a drain region, with a pinch-off point formed in the channel region near the drain region. In other words, to read information stored in either one of the charge storage sections 161, 162, it is preferable to form a pinch-off point in the channel region near the other charge storage section. This enables the information stored in the charge storage section 161 to be detected with high sensitivity, regardless of the storage status of the charge storage section 162, contributing greatly to the realization of 2 bit operation.

Meanwhile, to store information only in either one of the charge storage sections 161, 162 or use both charge storage sections 161, 162 in an identical storage state, no pinch-off point is necessarily formed to read information.

It is preferable to form a well region (a p-well for an n-channel element) on the surface of the semiconductor substrate 111 (not shown in FIG. 8). The formation of a well region facilitates the control of electrical properties (withstand voltage, junction capacitance, short channel effects) while optimizing the impurity concentration in the channel region for memory operation (rewrite operation and read operation).

The charge storage sections 161, 162 preferably include the charge storing film 142 capable of charge storage and an insulating film in view of improvements of the memory's storage characteristics. In this embodiment, a silicon nitride film having a charge trapping level is used as the charge storing film 142, and the silicon oxide films 141, 143 preventing dispersion of the stored charges in the charge storing film 142 are used as the insulating film. The charge storage sections 161, 162 prevents electric charge dispersion by the inclusion of the charge storing film 142 and the insulating film, hence improving storage characteristics. Further, the charge storing film 142 can be reduced in volume to a more suitable level than in cases where the charge storage sections 161, 162 are fabricated only from the charge storing film 142. The reduction of the charge storing film in volume to a suitable level restricts the movement of charges in the charge storing film and restrains characteristics changes due to the movement of charges while data is being retained.

Figure 12:
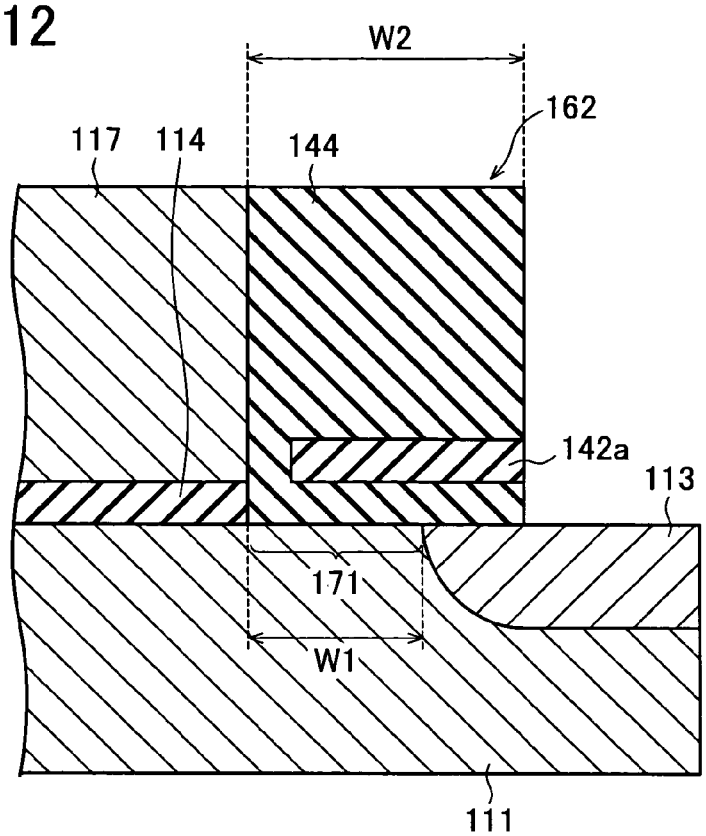
FIG. 12 is a schematic cross-sectional view of a major part of a variant of a semiconductor memory in accordance with the second embodiment of the present invention.

In addition, it is preferred if the charge storage sections 161, 162 are formed to include the charge storing film 142 substantially parallel to the surface of the gate insulating film 114, that is, the top surface of the charge storing film 142 in the charge storage sections 161, 162 is separated from the top surface of the gate insulating film 114 by equal distances. Specifically, as shown in FIG. 12, the charge storing film 142a in the charge storage section 162 has a surface substantially parallel to the surface of the gate insulating film 114. That is, the charge storing film 142a is preferably formed at a uniform height above the height corresponding to the surface of the gate insulating film 114. The presence of the charge storing film 142a substantially parallel to the surface of the gate insulating film 114 in the charge storage section 162 enables effective control of the likelihood of an inversion layer being formed in the offset regions 171 through the quantity of the electric charges stored in the charge storing film 142a, which leads to improvement of memory effects. In addition, the disposition of the charge storing film 142a substantially parallel to the surface of the gate insulating film 114 enables confinement of memory effect changes to relatively small ranges and resultant restraint of memory effect irregularities, even when the offset (W1) changes. Besides, the movement of electric charges to the upper part of the charge storing film 142a is restrained; characteristics changes due to the electric charge movement are restrained while data is being retained.

Further, the charge storage section 162 preferably includes an insulating film (e.g., part of the silicon oxide film 144 above the offset regions 171) which separates the channel region (or well region) from the charge storing film 142a substantially parallel to the surface of the gate insulating film 114. The insulating film restrains the dispersion of electric charges stored in the charge storing film 142a and improves storage characteristics of the semiconductor memory.

Controlling the thickness of the charge storing film 142a and regulating the thickness of the insulating film under the charge storing film 142a (part of the silicon oxide film 144 above the offset regions 171) at a constant value enables regulation of the distances from the surface of the semiconductor substrate 111 to the electric charges stored in the charge storing film 142a at a substantially equal value. That is, the distances from the surface of the semiconductor substrate 111 to the electric charges stored in the charge storing film 142a can be regulated from a minimum thickness of the insulating film under the charge storing film 142a up to the sum of a maximum thickness of the insulating film under the charge storing film 142a and a maximum thickness of the charge storing film 142a. This substantially enables control of the density of lines of electric force generated by the electric charges stored in the charge storing film 142a and hence reduction of magnitude irregularities of the memory element's memory effects to very small levels.

Embodiment 3

Figure 13:
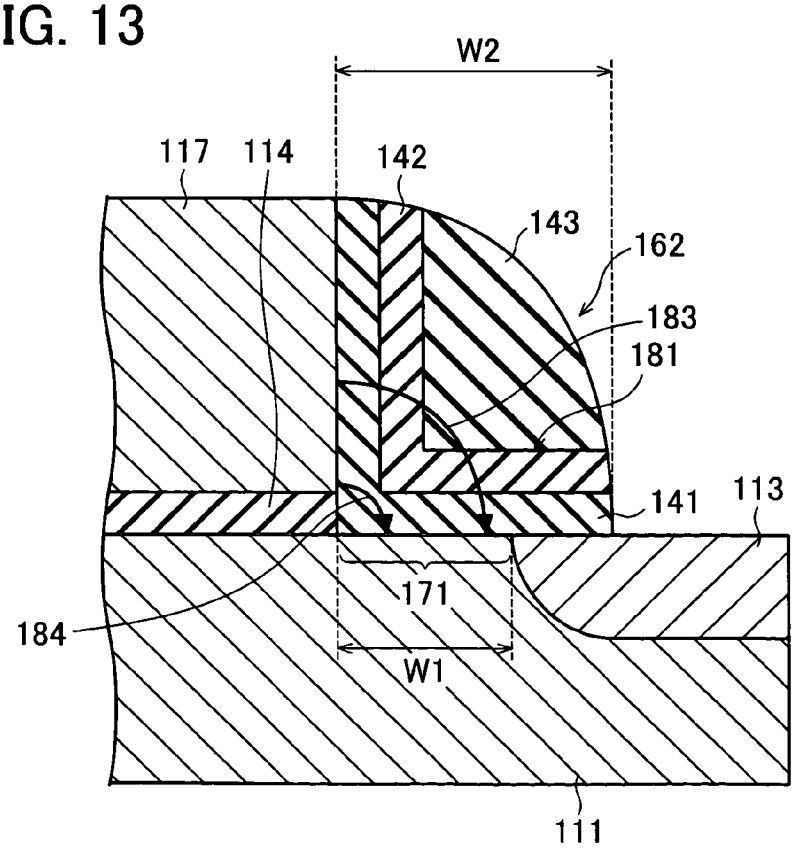
FIG. 13 is a schematic cross-sectional view of a major part of a semiconductor memory in accordance with a third embodiment of the present invention.

This embodiment relates to the structure of the charge storing film 142 in the semiconductor memory in accordance with the second embodiment. In accordance with the embodiment, as shown in FIG. 13, the charge storing film 142 in the charge storage section 162 has a substantially uniform thickness and is made up of a first section 181 substantially parallel to the surface of the gate insulating film 114 and a second section 182 substantially parallel to a side face of the gate electrode 117.

When positive voltage is applied to the gate electrode 117, the lines of electric force in the charge storage section 162 pass through the silicon nitride film 142 twice (the first section 181 and the second section 182) as indicated by an arrow 183. When negative voltage is applied to the gate electrode 117, the direction of the lines of electric force is opposite. Here, the silicon nitride film 142 has a relative permittivity of about 6, and the silicon oxide films 141, 143 have a relative permittivity of about 4. Therefore, the charge storage section 162 has a greater effective relative permittivity along the lines of electric force 183 and produces a smaller potential difference between the ends of the lines of electric force than when the charge storing film 142 has only the first section 181. In other words, great part of the voltage applied to the gate electrode 117 is used to reinforce the electric field in the offset regions 171.

During rewrite operation, electric charges are injected to the silicon nitride film 142, because generated charges are drawn into the film 142 by the electric field in the offset regions 171. Therefore, the inclusion of the second section 182 in the charge storing film 142 increases charges injected into the charge storage section 162 during rewrite operation, achieving increased rewrite rate.

If the silicon oxide film 143 were a silicon nitride film, that is, if the charge storing film 142 is not uniform with respect to the height corresponding to the surface of the gate insulating film 114, the upward movement of electric charges in the charge storing film 142 (silicon nitride film) would be encouraged, degrading storage characteristics.

The charge storing film 142 is preferably formed of, instead of a silicon nitride film, hafnium oxide or another highly dielectric material with a very high relative permittivity.

It is preferred if the charge storage section 162 includes the insulating film (part of the silicon oxide film 141 above the offset regions 171) separating the charge storing film 142 substantially parallel to the surface of the gate insulating film 114 from the channel region (or well region). The insulating film restrains the dispersion of electric charges stored in the charge storing film 142 and improves storage characteristics.

It is preferred if the charge storage section 162 further includes an insulating film (part of the silicon oxide film 141 in contact with the gate electrode 117) separating the gate electrode 117 from a charge storing film extending substantially parallel to a side face of the gate electrode 117. The insulating film prevents charge injection from the gate electrode 117 to the charge storing film 142 and accompanying changes in electrical characteristics, improving the reliability of the semiconductor memory.

Further, similarly to the second embodiment, it is preferable to control the thickness of the insulating film (part of the silicon oxide film 141 above the offset regions 171) under the charge storing film 142 at a constant value and to control the thickness of the insulating film (part of the silicon oxide film 141 in contact with the gate electrode 117) on the side face of the gate electrode 117 at a constant value. This substantially enables control of the density of the lines of electric force generated by the electric charges stored in the charge storing film 142 and hence prevention of charge leaks.

Embodiment 4

The present embodiment relates to optimization of the distance among the gate electrode, charge storage sections, and source/drain regions in the semiconductor memory in accordance with the second embodiment.

Figure 14:
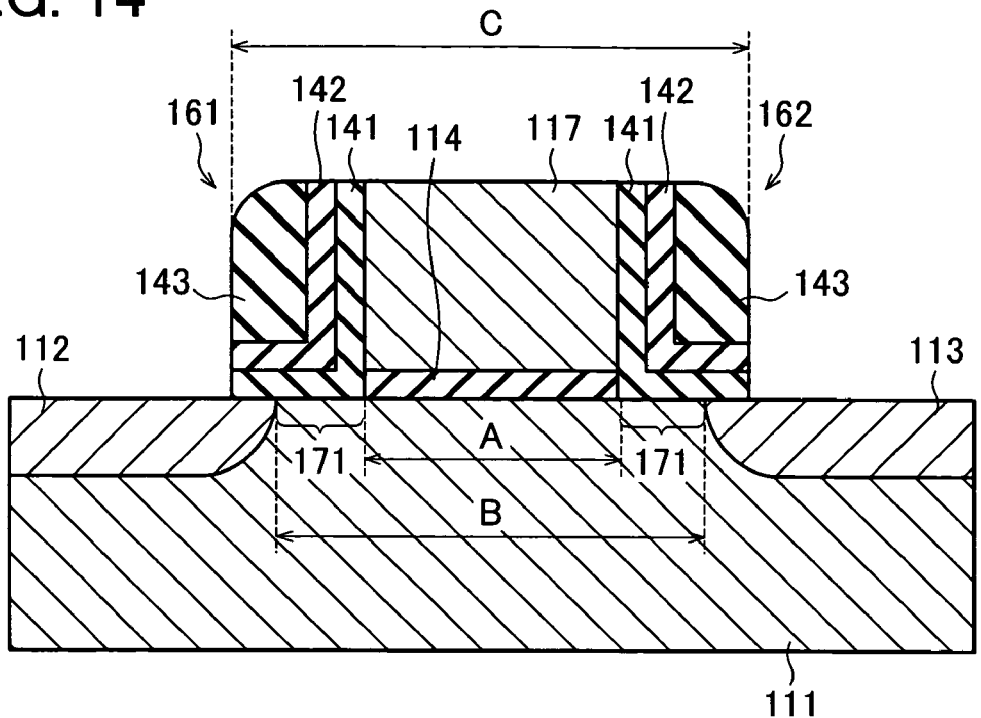
FIG. 14 is a schematic cross-sectional view of a major part of a semiconductor memory in accordance with a fourth embodiment of the present invention.

Referring to FIG. 14, A represents the length of the gate electrode 117 in a cross-section in the channel length direction. B represents the distance between the source/drain regions (channel length). C represents the distance from the end of one of the charge storage sections 161, 162 to the end of the other charge storage section, that is, the distance, in a cross-section in the channel length direction, from an end of the film 142 with a charge storing function (opposite to the gate electrode 117) in one of the charge storage sections 161, 162 to an end of the film 142 with a charge storing function in the other charge storage section (opposite to the gate electrode 117).

First, it is preferred if B<C. The offset regions 171 are present in the channel region between the bed for the gate electrode 117 and the source/drain regions 112, 113. Since B<C, the likelihood of inversion effectively changes throughout the offset regions 171 due to the charge stored in the charge storage sections 161, 162 (silicon nitride film 142). This improves memory effects and especially increases the read rate.

When the gate electrode 117 offsets with respect to the source/drain regions 112, 113, that is, when A<B, the likelihood of inversion in the offset regions under the application of voltage to the gate electrode 117 vastly changes with the electric charge stored in the charge storage sections 161, 162. This improves memory effects and lowers short channel effects. The offset regions 171 are not necessary provided that memory effects are existent. In the absence of the offset regions 171, memory effects are existent in the charge storage sections 161, 162 (silicon nitride film 142) at sufficiently high impurity concentrations in the source/drain regions 112, 113. Therefore, it is most preferred if A<B<C.

Embodiment 5

Figure 15:
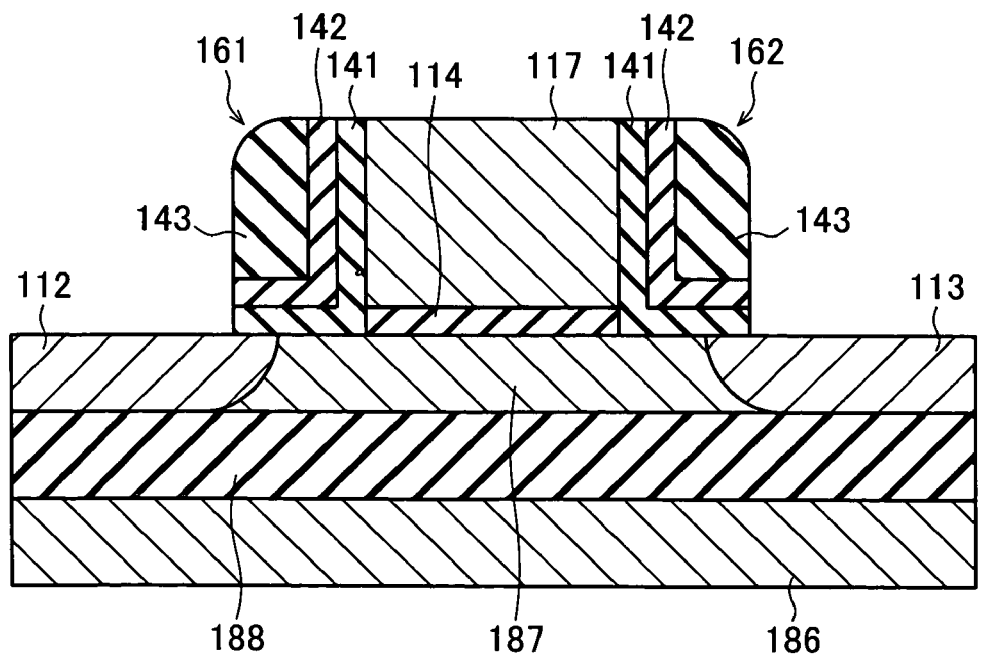
FIG. 15 is a schematic cross-sectional view of a major part of a semiconductor memory in accordance with a fifth embodiment of the present invention.

A semiconductor memory in accordance with the embodiment, as shown in FIG. 15, has a substantially identical arrangement to embodiment 2, except that a semiconductor substrate replaces the SOI substrate in accordance with embodiment 2.

In the semiconductor memory, an embedded oxidation film 188 is formed on a semiconductor substrate 186. On the film 188, there is provided an SOI layer. In the SOI layer, diffusion layer regions 112, 113 are formed. Other regions constitute a body region 187.

The semiconductor memory produces similar function and effects to the semiconductor memory in accordance with embodiment 3. Further, the junction capacitance between the diffusion layer regions 112, 113 and the body region 182 can be reduced to an extremely low value, enabling the element to achieve high speed and low power consumption.

Embodiment 6

Figure 16:
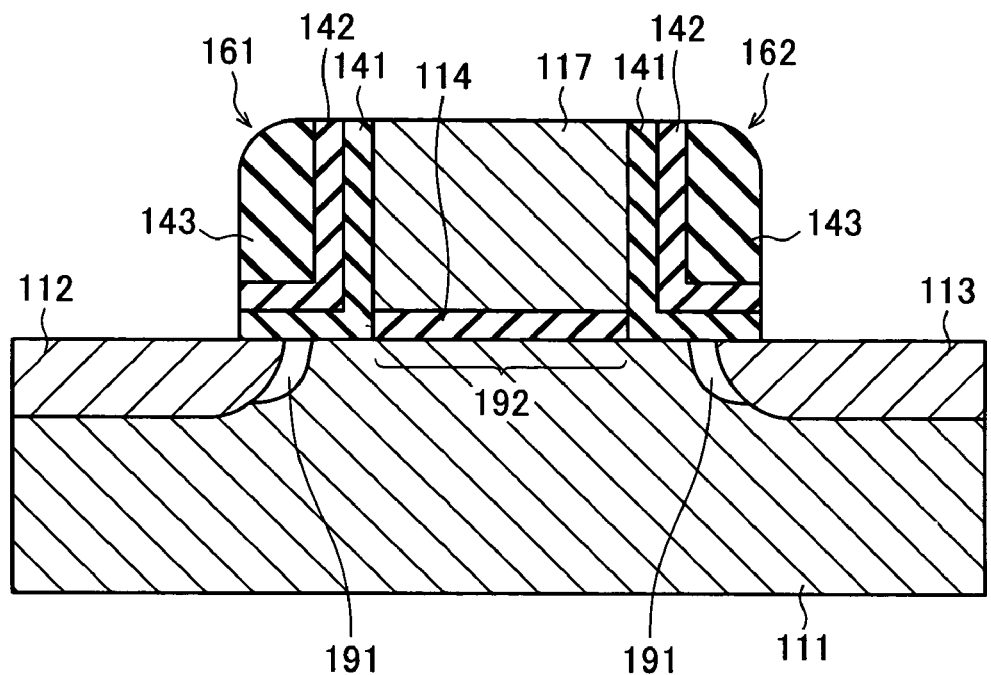
FIG. 16 is a schematic cross-sectional view of a major part of a semiconductor memory in accordance with a sixth embodiment of the present invention.

A semiconductor memory in accordance with the embodiment, as shown in FIG. 16, has a substantially identical arrangement to the second embodiment, except that in the former, p-type high concentration regions 191 adjacent to the channel sides of the n-type source/drain regions 112, 113 are added to the second embodiment.

That is, the p-type high concentration regions 191 have a higher concentration of p-type impurities (e.g., boron) than a region 192. The p-type impurity concentration in the p-type high concentration regions 191 is, for example, appropriately $5 \times 10^{17}$ to $1 \times 10^{19}$ cm$^{-3}$. The p-type impurity concentration in the region 192 is, for example, $5 \times 10^{16}$ to $1 \times 10^{18}$ cm$^{-3}$.

The provision of the p-type high concentration regions 191 renders the junction between the diffusion layer regions 112, 113 and the semiconductor substrate 111 sharp right under the charge storage sections 161, 162. This facilitates the generation of hot carriers in write and erase operation, which either decreases voltage in write and erase operation or enables high speed write and erase operation. Further, since the region 192 has a relatively low impurity concentration, the threshold value is low, and the drain current is high when the memory is in an erase state. This improves the read rate. Therefore, the semiconductor memory obtained has low rewrite voltage or high rewrite rate and high read rate.

In addition, in FIG. 16, the provision of the p-type high concentration regions 191 below the charge storage sections 161, 162 near the diffusion layer regions 112, 113 (source/drain regions) (i.e., not right under the gate electrode) the threshold value of the transistor as a whole greatly increases. The increases are extremely large when compared to cases where the p-type high concentration regions 191 are right under the gate electrode 117. The difference becomes greater when the charge storage sections 161, 162 is retaining write charges (electrons in cases where the transistor is of the n-channel type). Meanwhile, when the charge storage sections is retaining sufficient erase charges (holes in cases where the transistor is of the n-channel type), the threshold value of the transistor as a whole decreases to a value determined by the impurity concentration in the channel region (region 192) under the gate electrode 117. In other words, the threshold value in erase operation does not depend on the impurity concentration of the p-type high concentration regions 191, but the threshold value in write operation, in contrast, is seriously affected by the impurity concentration. Therefore, the provision of the p-type high concentration regions 191 below the charge storage sections 161, 162 near the diffusion layer regions 112, 113 (source/drain regions) causes the threshold value to vary greatly only in write operation and remarkably improves memory effects (difference in threshold value between write and erase operation).

Embodiment 7

Figure 17:
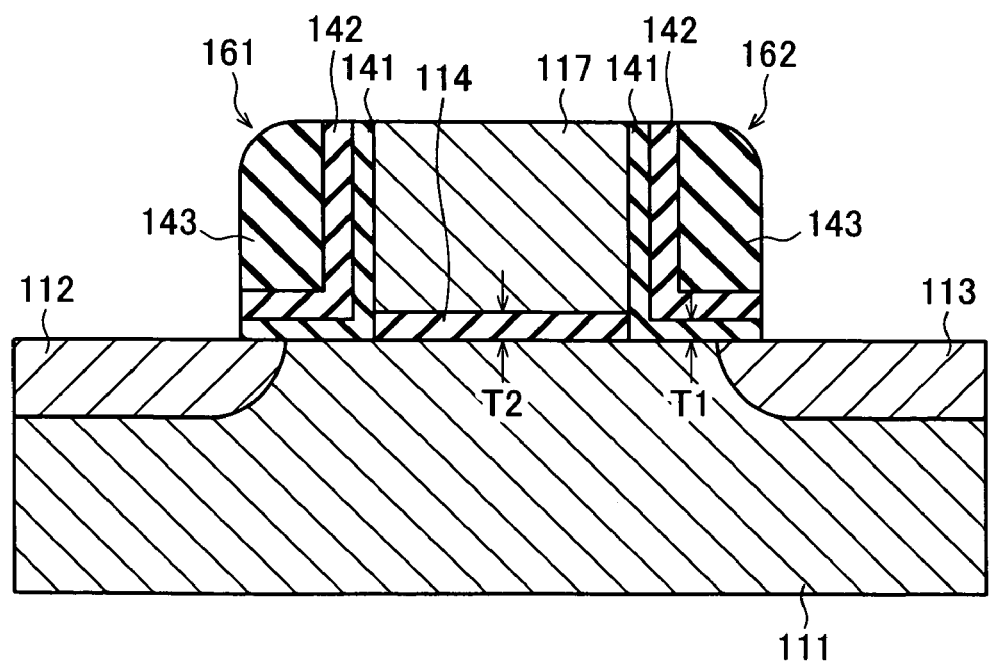
FIG. 17 is a schematic cross-sectional view of a major part of a semiconductor memory in accordance with a seventh embodiment of the present invention.

A semiconductor memory in accordance with the embodiment, as shown in FIG. 17, has a substantially identical arrangement to the second embodiment, except that in the former, the thickness T1 of the insulating film 141 separating a charge storing film (silicon nitride film 142) from a channel region or well region is smaller than the thickness T2 of the gate insulating film 114.

The thickness T2 of the gate insulating film 114 has a lower limit due to withstand voltage requirements in the memory's rewrite operation. However, the thickness T1 of the insulating film 141 separating the charge storing film (silicon nitride film 142) from the channel region or well region can be made less than T2 regardless of withstand voltage requirements.

In the semiconductor memory in accordance with the present embodiment, the thickness T1 of the insulating film 141 has a high degree of freedom in design for the following reasons: In the semiconductor memory in accordance with the present embodiment, the insulating film 141 separating the charge storing film 142 from the channel region or well region is not sandwiched between the gate electrode 117 and the channel region or well region. Therefore, the insulating film 141 separating the charge storing film 142 from the channel region or well region is not directly acted on by the intense electric field between the gate electrode 117 and the channel region or well region, but acted on by a relatively weak electric field extending sideways from the gate electrode 117. This enables the T1<T2 setting regardless of withstand voltage requirements on the gate insulating film 114. Meanwhile, for example, in EEPROMs (Electrically Erasable/Programmable Read Only Memories) of which a typical example is a flash memory, the insulating film separating the floating gate from the channel region or well region is sandwiched between the gate electrode (control gate) and the channel region or well region, and therefore acted on directly by the intense electric field generated by the gate electrode. Hence, in an EEPROM, the thickness of the insulating film separating the floating gate from the channel region or well region is restricted, which obstructs optimization of the functions of the memory element. As is clear from the foregoing, in the memory element in accordance with the present embodiment, the degree of freedom in design of T1 is high essentially because the insulating film 141 separating the charge storing film 142 from the channel region or well region is not sandwiched between the gate electrode 117 and the channel region or well region.

Decreasing the thickness T1 of the insulating film 141 facilitates charge injection to the charge storage sections 161, 162, and reduces voltage in write and erase operation or enables high speed write and erase operation. Further, since electric charges are generated in greater number in the channel region or well region when the charge storing film (silicon nitride film) 142 is retaining charges, memory effects are improved.

Incidentally, some of the lines of electric force in the charge storage sections, as indicated by the arrow 184 in FIG. 13, are too short to pass through the charge storing film (silicon nitride film) 142. The electric field along such short lines of electric force is relatively intense, and performs an important function in rewrite operation. Decreasing the thickness T1 of the insulating film 141 results in the charge storing film (silicon nitride film) 142 repositioning itself close to the bottom of FIG. 13 and the lines of electric force indicated by the arrow 184 coming to pass through the charge storing film (silicon nitride film) 142. For these reasons, the effective relative permittivity in the charge storage section 162 along the lines of electric force 184 increases, enabling further reductions in the potential difference between the ends of the lines of electric force 184.

Therefore, great part of the voltage applied to the gate electrode 117 is used to reinforce the electric field in the offset regions 171, enabling high speed write and erase operation.

As is clear from the foregoing, if the thickness T1 of the insulating film 141 separating the charge storage film 142 from the channel region or well region and the thickness T2 of the gate insulating film 114 are specified to have a relationship, T1<T2, either voltage in write and erase operation is decreased or the write and erase rate is increased, and memory effects are improved, without degrading the withstand voltage capability of the memory.

The thickness T1 of the insulating film is preferably 0.8 nm or greater. The 0.8 nm value is the limit where uniformity and film quality in the manufacturing process are maintained at a certain level without seriously degrading storage characteristics.

Specifically, in cases of liquid crystal driver LSIs which require a high withstand voltage where a design rule is large, the LSIs needs a maximum voltage of 15 to 18 V to drive liquid crystal panel TFTs (Thin Film Transistors). Therefore, the gate oxidation film cannot be reduced in thickness. When an involatile memory in accordance with the present invention is mounted along with other components to a liquid crystal driver LSI for image adjustment, the memory element in accordance with the present invention allows optimal design of the thickness T1 of the insulating film 141 separating the charge storing film (silicon nitride film) 142 from the channel region or well region independently from the thickness T2 of the gate insulating film 114. For example, T1 and T2 can be individually set in a memory cell with a gate electrode length (word line width) of 250 nm so that T1=20 nm, T2=10 nm. The resultant memory cell has good write efficiency. (Short channel effects do not occur even if T1 is thicker than ordinary logic transistors, because the diffusion layer regions 112, 113 (source/drain regions) offset with respect to the gate electrode 117.)

Embodiment 8

Figure 18:
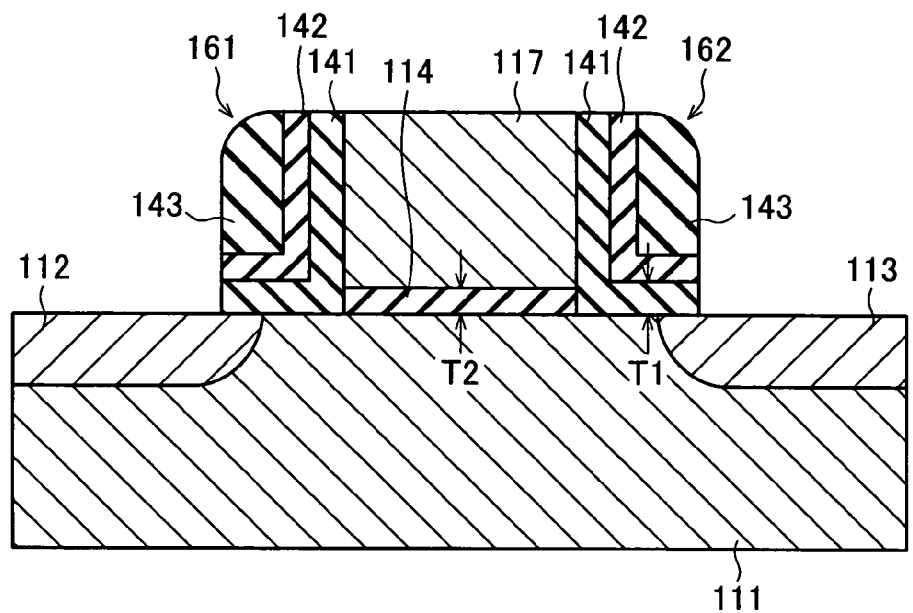
FIG. 18 is a schematic cross-sectional view of a major part of a semiconductor memory in accordance with an eighth embodiment of the present invention.

A semiconductor memory in accordance with the embodiment, as shown in FIG. 18, has a substantially identical arrangement to the second embodiment, except that in the former, the thickness T1 of the insulating film 141 separating the charge storing film (silicon nitride film) 142 from the channel region or well region is thicker than the thickness T2 of the gate insulating film 114.

The thickness T2 of the gate insulating film 114 has an upper limit due to short channel effects prevention requirements of the element. However, the thickness T1 of the insulating film 141 under the charge storing film 142 may be greater than T2 regardless of the short channel effects prevention requirements. In other words, such a design is possible where the thickness of the insulating film 141 separating the charge storing film (silicon nitride film) 142 from the channel region or well region is optimized independently from the thickness T2 of the gate insulating film at advanced levels of miniaturization scaling (the gate insulating film 114 reduced in thickness); therefore, the charge storage section 162 does not obstruct scaling.

In the semiconductor memory in accordance with the present embodiment, the degree of freedom in design of the thickness T1 of the insulating film 141 is high because as mentioned earlier, the insulating film 141 separating the charge storing film 142 from the channel region or well region is not sandwiched between the gate electrode 117 and the channel region or well region. Therefore, T1 can be made greater than T2 regardless of the short channel effects prevention requirements on the gate insulating film 114.

A greater thickness T1 of the insulating film 141 prevents electric charge dispersion from the charge storage section 162 and improves storage characteristics of the memory.

Therefore, where T1>T2, storage characteristics are improved without degrading short channel effects of the memory.

The thickness T1 of the insulating film 141 is preferably 20 nm or less, considering decreases in rewrite rate.

Specifically, in conventional involatile memories of which a typical example is a flash memory, a selection gate electrode constitutes a write erase gate electrode, and a gate insulating film corresponding to the write erase gate electrode (inclusive of a floating gate) doubles as a charge retaining film. Therefore, the miniaturization requirement (film thickness must be reduced to restrain short channel effects) contradicts the requirement to secure reliability (to restrain leaks of storage charge, the thickness of the insulating film separating the floating gate from the channel region or well region cannot be reduced further than about 7 nm). Miniaturization is thus difficult. In fact, the ITRS (International Technology Roadmap for Semiconductors) fails to give concrete predictions for the miniaturization of physical gate lengths below 0.2 microns. The semiconductor memory in accordance with the present invention, as mentioned earlier, allows separate specifications for T1 and T2, hence further miniaturization. For example, according to the present invention, T1 and T2 can be individually set in a memory cell with a gate electrode length (word line width) of 45 nm so that T2=4 nm, T1=7 nm. The resultant semiconductor memory is free from short channel effects. Short channel effects do not occur even if T2 is specified to be thicker than ordinary logic transistors, because the source/drain regions offset with respect to the gate electrode. In addition, in the semiconductor memory in accordance with the present invention, the source/drain regions offset with respect to the gate electrode; therefore, miniaturization is facilitated further than in ordinary logic transistors.

As in the foregoing, according to the semiconductor memory in accordance with the present embodiment, there are no electrodes provided on the charge storage sections to assist writing and erasing of data; therefore, the insulating film separating the charge storing film from the channel region or well region is not directly acted on by the intense electric field produced between the write/erase assisting electrode and the channel region or well region, but only acted on by the relatively weak electric field which extends sideways from the gate electrode. Therefore, the resultant memory cell can have a gate length reduced to or below the gate length of logic transistors of the same generation.

Embodiment 9

The present embodiment relates to changes in electrical properties in rewrite operation of the semiconductor memory in accordance with the first embodiment in FIG. 3 of the present invention.

Figure 19:
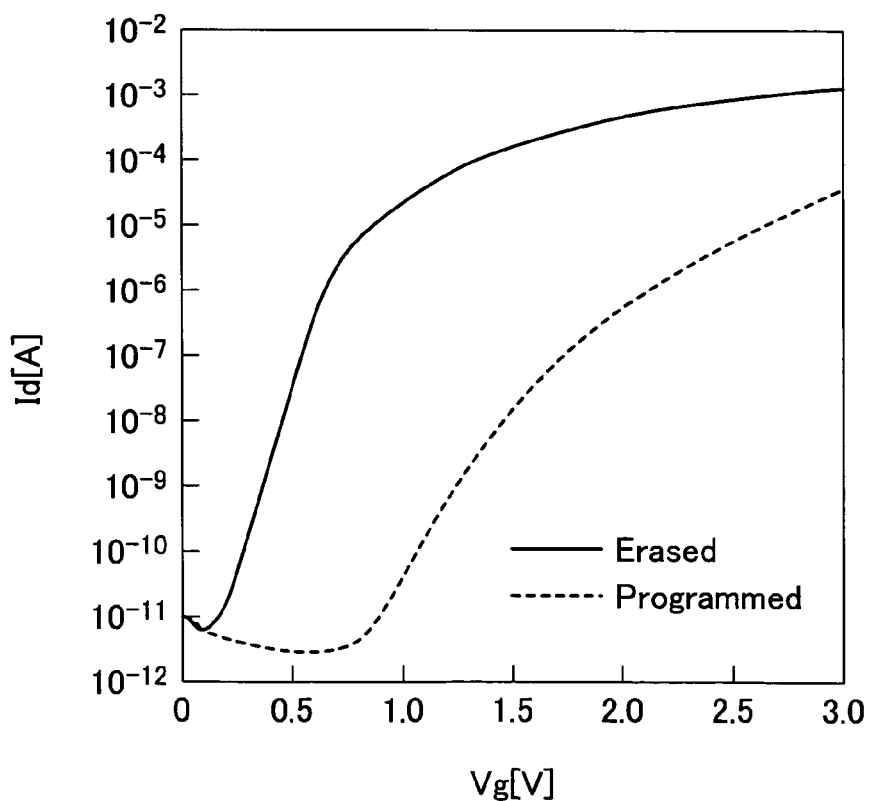
FIG. 19 is a graph showing an electrical property of a semiconductor memory in accordance with a ninth embodiment of the present invention.
Figure 20:
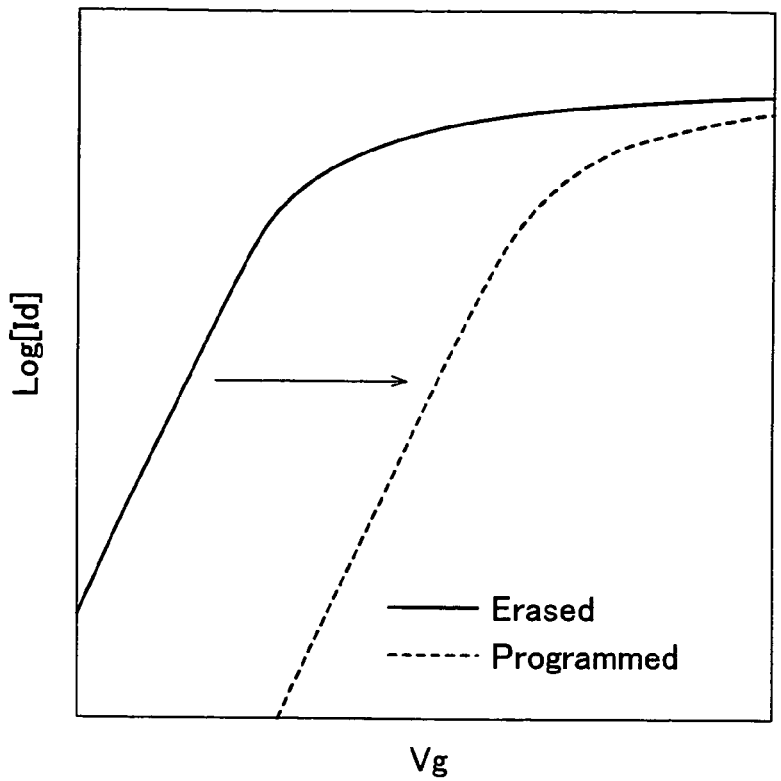
FIG. 20 is a graph showing an electrical property of a conventional flash memory.
Figure 21:
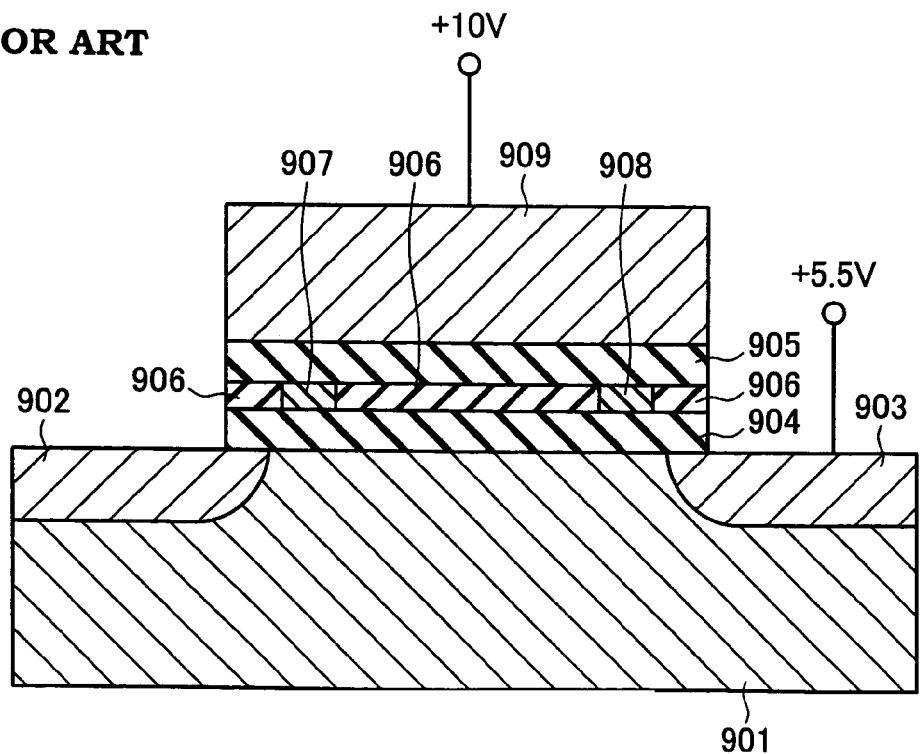
FIG. 21 is a schematic cross-sectional view of a major part of a conventional semiconductor memory.

FIG. 19 shows a curve representing changes of a drain current Id (A) versus changes of a gate voltage Vg (V) in erase and write states where the electric charge in the charge storage sections of an n-channel type memory element differ. The gate voltage Vg (V) is indicated along the horizontal axis, and the drain current Id (A) along the vertical axis. As is clear from FIG. 19, when a write operation is done in the erase state (solid line), the threshold value does not only rise simply, but the inclination of the graph markedly decreases, especially in the subthreshold region. Therefore, the drain current ratio between the erase and write states is high even where the gate voltage (Vg) is relatively high. For example, even at Vg=2.5 V, the electric current ratio is still greater than or equal to 100. This characteristic greatly differs from the case of a flash memory shown in FIG. 20. FIG. 20 shows a curve representing changes of a drain current Id (A) versus changes of a gate voltage Vg (V) in a flash memory in erase and write states, similarly to FIG. 19.

The occurrence of the characteristic in the semiconductor memory in accordance with the present embodiment is a unique phenomenon caused by the offsetting of the gate electrode from the diffusion layer regions and the difficulty experienced by the gate electric field in reaching an offset region. When the semiconductor memory is in a write state, it is extremely difficult to generate an inversion layer in the offset regions below the charge storage sections under the application of positive voltage to the gate electrode. This is the reason for the small inclination of the Id–Vg curve in the subthreshold region in the write state. Meanwhile, when the semiconductor memory is in an erase state, electrons occur at a high density in the offset regions. And, when 0 V is applied to the gate electrode (that is, when in an off state), no electrons occur in the channel below the gate electrode (the off current is therefore small). This is a major reason for the large inclination of the Id–Vg curve in the subthreshold region in the erase state and the large rate of increase (conductance) of the current even in the region above the threshold.

As is clear from the foregoing, the semiconductor memory in accordance with the present invention is capable of an especially large drain current ratio between write and erase operations.

As in the foregoing the semiconductor memory in accordance with the first invention is arranged to include:

a p-type semiconductor film provided on a p-type semiconductor substrate, a p-type well region in a semiconductor substrate, or an insulator;

a gate insulating film formed on the p-type semiconductor film provided on a p-type semiconductor substrate, a p-type well region in a semiconductor substrate, or an insulator;

a gate electrode formed on the gate insulating film;

two charge storage sections formed on side walls of the gate electrode;

a channel region provided below the gate electrode; and a first n-type diffusion layer region and a second n-type diffusion layer region provided to sides of the channel region, wherein:

the charge storage sections are arranged to change an electric current flow between the first n-type diffusion layer region and the second n-type diffusion layer region under application of a voltage to the gate electrode according to a quantity of electric charge stored in the charge storage sections; and the first n-type diffusion layer region is set to a reference voltage, the second n-type diffusion layer region is set to a voltage greater than the reference voltage, and the gate electrode is set to a voltage greater than the reference voltage, so as to inject electrons to one of the charge storage sections near the second n-type diffusion layer region.

As in the foregoing, the semiconductor memory in accordance with the second invention is arranged to include:

an n-type semiconductor film provided on an n-type semiconductor substrate, an n-type well region in a semiconductor substrate, or an insulator;

a gate insulating film formed on the n-type semiconductor film provided on an n-type semiconductor substrate, an n-type well region in a semiconductor substrate, or an insulator;

a gate electrode formed on the gate insulating film;

two charge storage sections formed on side walls of the gate electrode;

a channel region provided below the gate electrode; and a first p-type diffusion layer region and a second p-type diffusion layer region provided to sides of the channel region, wherein:

the charge storage sections are arranged to change an electric current flow between the first p-type diffusion layer region and the second p-type diffusion layer region under application of a voltage to the gate electrode according to a quantity of electric charge stored in the charge storage sections; and the first p-type diffusion layer region is set to a reference voltage, the second p-type diffusion layer region is set to a voltage less than the reference voltage, and the gate electrode is set to a voltage less than the reference voltage, so as to inject holes to one of the charge storage sections near the second p-type diffusion layer region.

The semiconductor memory in accordance with the second invention is different from the semiconductor memory in accordance with the first invention in that the memory transistor is of a p-channel type. Therefore, the semiconductor memory in accordance with the second invention produces similar function and effects to the semiconductor memory in accordance with the first invention.

In a preferred aspect of the semiconductor memory in accordance with the first invention, the p-type semiconductor film provided on a p-type semiconductor substrate, a p-type well region in a semiconductor substrate, or an insulator is set to a voltage less than the reference voltage. In other words, a preferred aspect of the semiconductor memory in accordance with the first invention is characterized in that the embodiment includes:

a p-type semiconductor film provided on a p-type semiconductor substrate, a p-type well region in a semiconductor substrate, or an insulator;

a gate insulating film formed on the p-type semiconductor film provided on a p-type semiconductor substrate, a p-type well region in a semiconductor substrate, or an insulator;

a gate electrode formed on the gate insulating film;

two charge storage sections formed on side walls of the gate electrode;

a channel region provided below the gate electrode; and a first n-type diffusion layer region and a second n-type diffusion layer region provided to sides of the channel region, wherein the charge storage sections are arranged to change an electric current flow between the first n-type diffusion layer region and the second n-type diffusion layer region under application of a voltage to the gate electrode according to a quantity of electric charge stored in the charge storage sections; and the first n-type diffusion layer region is set to a reference voltage, the second n-type diffusion layer region is set to a voltage greater than the reference voltage, the gate electrode is set to a voltage greater than the reference voltage, and the p-type semiconductor film provided on a p-type semiconductor substrate, a p-type well region in a semiconductor substrate, or an insulator is set to a voltage less than the reference voltage, so as to inject electrons to one of the charge storage sections near the second n-type diffusion layer region.

The aspect again produces similar function and effects to the semiconductor memory in accordance with the first invention.

Further, the p-type semiconductor film provided on a p-type semiconductor substrate, a p-type well region in a semiconductor substrate, or an insulator is at a lower potential than the first n-type diffusion layer region; therefore, electrons can be injected into the charge storage section near the second n-type diffusion layer region at high efficiency. Therefore, the electric current value required for the electron injection is greatly reduced, which reduces power consumption in the semiconductor memory.

In addition, in a preferred aspect of the semiconductor memory in accordance with the second invention, the n-type semiconductor film provided on an n-type semiconductor substrate, an n-type well region in a semiconductor substrate, or an insulator is set to a voltage greater than the reference voltage. In other words, a preferred aspect of the semiconductor memory in accordance with the second invention is characterized in that the embodiment includes:

an n-type semiconductor film provided on an n-type semiconductor substrate, an n-type well region in a semiconductor substrate, or an insulator;

a gate insulating film formed on the n-type semiconductor film provided on a p-type semiconductor substrate, an n-type well region in a semiconductor substrate, or an insulator;

a gate electrode formed on the gate insulating film;

two charge storage sections formed on side walls of the gate electrode;

a channel region provided below the gate electrode; and a first p-type diffusion layer region and a second p-type diffusion layer region provided to sides of the channel region, wherein the charge storage sections are arranged to change an electric current flow between the first p-type diffusion layer region and the second p-type diffusion layer region under application of a voltage to the gate electrode according to a quantity of electric charge stored in the charge storage sections; and the first p-type diffusion layer region is set to a reference voltage, the second p-type diffusion layer region is set to a voltage less than the reference voltage, the gate electrode is set to a voltage less than the reference voltage, and the n-type semiconductor film provided on an n-type semiconductor substrate, an n-type well region in a semiconductor substrate, or an insulator is set to a voltage greater than the reference voltage, so as to inject holes to one of the charge storage sections near the second p-type diffusion layer region.

The preferred aspect of the semiconductor memory in accordance with the second invention is different from the preferred aspect of the semiconductor memory in accordance with the first invention in that the memory transistor is of a p-channel type. Therefore, the preferred aspect of the semiconductor memory in accordance with the second invention produces similar function and effects to the preferred aspect of the semiconductor memory in accordance with the first invention.

An embodiment is characterized by an offset structure where the gate electrode does not overlap the n-type or p-type diffusion layer regions with the gate insulating film intervening therebetween. An embodiment is characterized by an offset structure where the charge storage sections overlap the channel region between the first n-type or p-type diffusion layer region and the second n-type or p-type diffusion layer region.

According to the embodiment, the semiconductor memory has an "offset transistor structure," thereby achieving large memory effects.

In addition, an embodiment is characterized in that: the charge storage sections include a charge storing film capable of storing charge, a first insulating film, and a second insulating film; and the charge storage sections have a structure where the charge storing film is sandwiched between the first insulating film and the second insulating film.

In the embodiment, it is preferred if the charge storing film is made of silicon nitride; and the first and second insulating films are made of a silicon oxide. According to this, the charge storing film is a silicon nitride film and has many levels where electric charges (electrons and hole) are trapped. A result is large hysteresis. In addition, since the first and second insulating films are silicon oxide films, the charge storage sections have an "ONO (Oxide Nitride Oxide) film structure." This improves electric charge injection efficiency and increases a rewrite rate.

In addition, an embodiment is characterized in that: the first insulating film separates the charge storing film from the channel region or a well region; and above the channel region, the film made of a first insulator is at least 0.8 nm thick and is thinner than the gate insulating film.

According to the embodiment, the first insulating film separating the charge storing film from the channel region or a well region is at least 0.8 nm thick and is thinner than the gate insulating film; therefore, either voltage for write and erase operation is decreased or the write and erase rate is increased, and memory effects are improved, without degrading the withstand voltage capability of the memory.

In addition, an embodiment is characterized in that: the first insulating film separates the charge storing film from the channel region or a well region; and above the channel region, the first insulating film is at most 20 nm thick and is thicker than the gate insulating film.

According to the embodiment, the first insulating film separating the charge storing film from the channel region or a well region is at most 20 nm thick and is thicker than the gate insulating film; therefore, storage characteristics are improved without degrading short channel effects of the memory.

In addition, an embodiment is characterized in that the charge storing film, especially the silicon nitride film, has a part having a surface substantially parallel to a surface of the gate insulating film (opposite to the surface in contact with the semiconductor substrate).

According to the embodiment, the rewrite rate is increased while preventing degradation of electric charge storage characteristics of the semiconductor memory.

In addition, an embodiment is characterized in that the charge storing film, especially the silicon nitride film, has a part extending substantially parallel to a side face of the gate electrode (the face in contact with the charge storage sections).

According to the embodiment, the rewrite rate of the semiconductor memory is increased.

In addition, in an embodiment, the charge storing film, especially the silicon nitride film, has a part having a surface substantially parallel to a surface of the gate insulating film and also has a part extending substantially parallel to a side face of the gate electrode. According to the embodiment, the rewrite rate is increased while preventing degradation of electric charge storage characteristics of the semiconductor memory.

In addition, an embodiment is characterized in that the charge storage sections at least partly overlap part of the n-type or p-type diffusion layer regions.

According to the embodiment, the read electric current for the semiconductor memory is increased, and irregularities in read electric current is be restrained; therefore, the read rate of the semiconductor memory is increased.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory, comprising:
a p-type semiconductor film provided on a p-type semiconductor substrate, a p-type well region in a semiconductor substrate, or an insulator;
a gate insulating film formed on the p-type semiconductor film provided on the p-type semiconductor substrate, the p-type well region in a semiconductor substrate, or the insulator;
a single gate electrode formed on the gate insulating film;
two charge storage sections formed on side walls of the gate electrode;
a channel region provided below the gate electrode; and
a first n-type diffusion layer region and a second n-type diffusion layer region provided to sides of the channel region,
wherein:
the charge storage sections are arranged to change an electric current flow between the first n-type diffusion layer region and the second n-type diffusion layer region under application of a voltage to the gate electrode according to a quantity of electric charge stored in the charge storage sections; and
the first n-type diffusion layer region is set to a reference voltage, the second n-type diffusion layer region is set to a voltage greater than the reference voltage, and the gate electrode is set to a voltage greater than the reference voltage, so as to inject electrons to one of the charge storage sections near the second n-type diffusion layer region.

2. The semiconductor memory of claim 1, wherein the p-type semiconductor film provided on the p-type semiconductor substrate, the p-type well region in the semiconductor substrate, or the insulator is set to a voltage less than the reference voltage.

3. The semiconductor memory of claim 1, wherein the first and second n-type diffusion layer regions have an offset structure where the gate electrode does not overlap the first and second n-type diffusion layer regions with the gate insulating film intervening therebetween.

4. The semiconductor memory of claim 1, wherein the charge storage sections overlap the channel region between the first n-type diffusion layer region and the second n-type diffusion layer region.

5. The semiconductor memory of claim 1, wherein:
the charge storage sections include a charge storing film capable of storing charge, a first insulating film, and a second insulating film; and
the charge storage sections have a structure where the charge storing film is sandwiched between the first insulating film and the second insulating film.

6. The semiconductor memory of claim 5, wherein:
the charge storing film is made of silicon nitride; and
the first and second insulating films are made of a silicon oxide.

7. The semiconductor memory of claim 5, wherein:
the first insulating film separates the charge storing film from the channel region or a well region; and
above the channel region, the first insulating film is at least 0.8 nm thick and is thinner than the gate insulating film.

8. The semiconductor memory of claim 5, wherein:
the first insulating film separates the charge storing film from the channel region or a well region; and
above the channel region, the first insulating film is at most 20 nm thick and is thicker than the gate insulating film.

9. The semiconductor memory of claim 5, wherein the charge storing film has a part having a surface substantially parallel to a surface of the gate insulating film.

10. The semiconductor memory of claim 5, wherein the charge storing film has a part extending substantially parallel to a side face of the gate electrode.

11. The semiconductor memory of claim 5, wherein the charge storing film has a part having a surface substantially parallel to a surface of the gate insulating film and also has a part extending substantially parallel to a side face of the gate electrode.

12. The semiconductor memory of claim 1, wherein the charge storage sections at least partly overlap part of the n-type diffusion layer regions.

13. The semiconductor memory of claim 1, further comprising p-type high concentration regions, adjacent to channel region sides of the n-type diffusion layer regions, which have a greater p-type impurity concentration than the channel region.

14. A semiconductor memory, comprising:
an n-type semiconductor film provided on an n-type semiconductor substrate, an n-type well region in a semiconductor substrate, or an insulator;
a gate insulating film formed on the n-type semiconductor film provided on the n-type semiconductor substrate, the n-type well region in the semiconductor substrate, or the insulator;
a single gate electrode formed on the gate insulating film;
two charge storage sections formed on side walls of the gate electrode;
a channel region provided below the gate electrode; and
a first p-type diffusion layer region and a second p-type diffusion layer region provided to sides of the channel region,
wherein:
the charge storage sections are arranged to change an electric current flow between the first p-type diffusion layer region and the second p-type diffusion layer region under application of a voltage to the gate electrode according to a quantity of electric charge stored in the charge storage sections; and
the first p-type diffusion layer region is set to a reference voltage, the second p-type diffusion layer region is set to a voltage less than the reference voltage, and the gate electrode is set to a voltage less than the reference voltage, so as to inject holes to one of the charge storage sections near the second p-type diffusion layer region.

15. The semiconductor memory of claim 14, wherein the n-type semiconductor film provided on the n-type semiconductor substrate, the n-type well region in the semiconductor substrate, or the insulator is set to a voltage greater than the reference voltage.

16. The semiconductor memory of claim 14, wherein the p-type diffusion layer regions have an offset structure where the gate electrode does not overlap the p-type diffusion layer regions with the gate insulating film intervening therebetween.

17. The semiconductor memory of claim 14, wherein the charge storage sections overlap the channel region between the first p-type diffusion layer region and the second p-type diffusion layer region.

18. The semiconductor memory of claim 14, wherein:
the charge storage sections include a charge storing film capable of storing charge, a first insulating film, and a second insulating film; and
the charge storage sections have a structure where the charge storing film is sandwiched between the first insulating film and the second insulating film.

19. The semiconductor memory of claim 18, wherein:
the charge storing film is made of silicon nitride; and
the first and second insulating films are made of a silicon oxide.

20. The semiconductor memory of claim 18, wherein:
the first insulating film separates the charge storing film from the channel region or a well region; and
above the channel region, the first insulating film is at least 0.8 nm thick and is thinner than the gate insulating film.

21. The semiconductor memory of claim 18, wherein:
the first insulating film separates the charge storing film from the channel region or a well region; and
above the channel region, the first insulating film is at most 20 nm thick and is thicker than the gate insulating film.

22. The semiconductor memory of claim 18, wherein the charge storing film has a part having a surface substantially parallel to a surface of the gate insulating film.

23. The semiconductor memory of claim 18, wherein the charge storing film has a part extending substantially parallel to a side face of the gate electrode.

24. The semiconductor memory of claim 18, wherein the charge storing film has a part having a surface substantially parallel to a surface of the gate insulating film and also has a part extending substantially parallel to a side face of the gate electrode.

25. The semiconductor memory of claim 14, wherein the charge storage sections at least partly overlap part of the p-type diffusion layer regions.

26. The semiconductor memory of claim 14, further comprising n-type high concentration regions, adjacent to channel region sides of the p-type diffusion layer regions, which have a greater n-type impurity concentration than the channel region.

27. The semiconductor memory of claim 5, wherein:
the charge storing film includes a first part and a second part, the first part having a surface substantially parallel to a surface of the gate insulating film, the second part extending substantially parallel to a side face of the gate electrode; and
the first n-type diffusion layer region and the second n-type diffusion layer region are formed so that the channel region faces an end of the second part in a thickness direction of the gate electrode.

28. The semiconductor memory of claim 27, wherein:
the first part extends outward from an end of the second part in the thickness direction of tile gate electrode, the end facing the channel region.

29. The semiconductor memory of claim 28, wherein:
the first part partly overlaps either the first n-type diffusion layer region or the second n-type diffusion layer region.

30. The semiconductor memory of claim 18, wherein:
the charge storing film includes a first part and a second part, the first part having a surface substantially parallel to a surface of the gate insulating film, the second part extending substantially parallel to a side face of the gate electrode; and
the first p-type diffusion layer region and the second p-type diffusion layer region are formed so that the channel region faces an end of the second part in a thickness direction of the gate electrode.

31. The semiconductor memory of claim 30, wherein:
the first part extends outward from an end of the second part in the thickness direction of the gate electrode, the end facing the channel region.

32. The semiconductor memory of claim 31, wherein:
the first part partly overlaps either the first p-type diffusion layer region or the second p-type diffusion layer region.

33. The semiconductor memory of claim 4, wherein:
the overlap W2–W1 of the charge storage sections and the channel region is greater than 10 nm, where W1 is the amount of offset between edge of the gate electrode and either of the first and second diffusion layer regions, W2 is the width of the charge storage section taken along the channel length of the channel region.

34. The semiconductor memory of claim 14, wherein:
the overlap W2–W1 of the charge storage sections and the channel region is greater than 10 nm, where W1 is the amount of offset between edge of the gate electrode and either of the first and second diffusion layer regions, W2 is the width of the charge storage section taken along the channel length of the channel region.

35. The semiconductor memory of claim 1, wherein
the first n-type diffusion layer region is set to the reference voltage, the second n-type diffusion layer region is set to a voltage greater than the reference voltage, the gate electrode is set to a voltage greater than the reference voltage and less than the voltage of the second n-type diffusion layer region, so as to inject electrons to one of the charge storage sections near the second n-type diffusion layer region.

36. The semiconductor memory of claim 14, wherein
the first p-type diffusion layer region is set to the reference voltage, the second p-type diffusion layer region is set to a voltage less than the reference voltage, the gate electrode is set to a voltage less than the reference voltage and greater than the voltage of the second p-type diffusion layer region, so as to inject holes to one of the charge storage sections near the second p-type diffusion layer region.

37. The semiconductor memory of claim 6, wherein:
the silicon nitride film has a thickness of 2 nm to 15 nm; and
if the first insulating film and the second insulating film are made of a silicon oxide, the silicon oxide films each have a thickness of 1.5 nm to 10 nm.

38. The semiconductor memory of claim 19, wherein:
the silicon nitride film has a thickness of 2 nm to 15 nm; and
if the first insulating film and the second insulating film are made of a silicon oxide, the silicon oxide films each have a thickness of 1.5 nm to 10 nm.

39. The semiconductor memory of claim 1, wherein
the gate electrode does not cover the charge storage sections.

40. The semiconductor memory of claim 14, wherein
the gate electrode does not cover the charge storage sections.

* * * * *